(12) United States Patent
Lee et al.

(10) Patent No.: US 11,263,975 B2
(45) Date of Patent: Mar. 1, 2022

(54) DISPLAY APPARATUS

(71) Applicant: Samsung Display Co., Ltd., Yongin-si (KR)

(72) Inventors: Jeongho Lee, Yongin-si (KR); Zail Lhee, Yongin-si (KR); Jonghak Hwang, Yongin-si (KR); Sanghun Oh, Yongin-si (KR); Sanghun Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/025,377

(22) Filed: Sep. 18, 2020

(65) Prior Publication Data

US 2021/0233474 A1    Jul. 29, 2021

(30) Foreign Application Priority Data

Jan. 28, 2020 (KR) .......... 10-2020-0010032

(51) Int. Cl.
  *G09G 3/3266* (2016.01)
  *G09G 3/3225* (2016.01)
  *G09G 3/3275* (2016.01)

(52) U.S. Cl.
  CPC ......... *G09G 3/3266* (2013.01); *G09G 3/3225* (2013.01); *G09G 3/3275* (2013.01)

(58) Field of Classification Search
  CPC ............... H01L 27/3276; H01L 27/323; H01L 51/5253; H01L 27/3244; G06F 3/0412; G06F 1/1686; G09G 2300/0426; G09G 3/3225; G09G 3/3266; G09G 3/3275; G09G 3/322
  See application file for complete search history.

(56) References Cited

U.S. PATENT DOCUMENTS

| | | | |
|---|---|---|---|
| 10,381,381 B1 | 8/2019 | Choi et al. | |
| 10,955,965 B2* | 3/2021 | Park | G06F 3/044 |
| 2013/0258234 A1 | 10/2013 | Park et al. | |
| 2015/0220191 A1* | 8/2015 | Huh | G06F 3/0446 |
| | | | 345/173 |
| 2017/0148856 A1* | 5/2017 | Choi | H01L 51/0096 |
| 2017/0162111 A1* | 6/2017 | Kang | H01L 27/3276 |
| 2017/0162637 A1* | 6/2017 | Choi | G09G 3/20 |
| 2017/0237037 A1* | 8/2017 | Choi | H01L 27/323 |
| | | | 257/40 |
| 2017/0287992 A1 | 10/2017 | Kwak et al. | |
| 2017/0294502 A1* | 10/2017 | Ka | H01L 27/3276 |

(Continued)

FOREIGN PATENT DOCUMENTS

| | | |
|---|---|---|
| KR | 10-1406129 | 6/2014 |
| KR | 10-2017-0103159 | 9/2017 |
| KR | 10-2017-0113066 | 10/2017 |

*Primary Examiner* — Koosha Sharifi-Tafreshi
(74) *Attorney, Agent, or Firm* — Kile Park Reed & Houtteman PLLC

(57) ABSTRACT

A display apparatus includes a substrate including a first area, a display area surrounding the first area, and a non-display area surrounding the display area; pixels disposed in the display area; scan lines extending in a first direction and disconnected in the first area; data lines extending in a second direction intersecting the first direction and disconnected in the first area; and data connection lines electrically connecting the data lines disconnected in the first area.

25 Claims, 27 Drawing Sheets

(56) References Cited

U.S. PATENT DOCUMENTS

| | | | |
|---|---|---|---|
| 2019/0115415 A1* | 4/2019 | Choi | G09G 3/3233 |
| 2019/0130822 A1 | 5/2019 | Jung et al. | |
| 2020/0160761 A1 | 5/2020 | Ahn et al. | |
| 2020/0176527 A1* | 6/2020 | An | G09G 3/3233 |
| 2020/0176542 A1* | 6/2020 | Park | H01L 51/0096 |

* cited by examiner

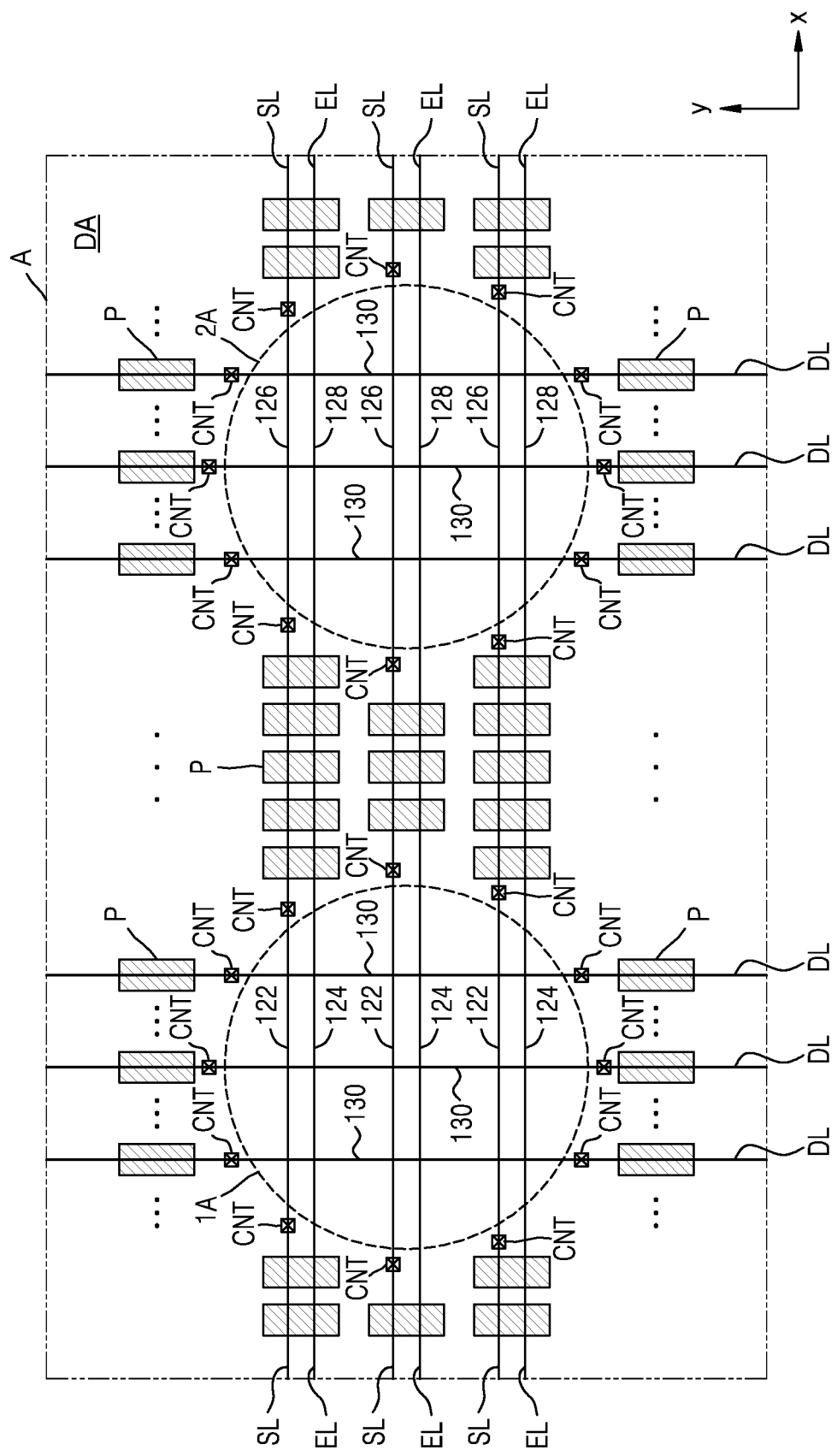

DISPLAY APPARATUS

CROSS-REFERENCE TO RELATED APPLICATIONS

This application claims priority to and benefits of Korean Patent Application No. 10-2020-0010032 under 35 U.S.C. § 119, filed on Jan. 28, 2020, in the Korean Intellectual Property Office, the entire contents of which are incorporated herein by reference.

BACKGROUND

1. Technical Field

One or more embodiments relate to a display apparatus, and, to a display apparatus including a first area within a display area.

2. Description of the Related Art

Recently, display apparatuses are used in various fields. Also, as the thickness and weight of display apparatuses have been reduced, the range of use of the display apparatuses has widened.

An increase in the occupied areas of display areas in display apparatuses may result in the addition of functions embedded onto or linked with the display apparatuses. To add various functions while increasing the areas of the display areas, research has been conducted into display apparatuses in which various components may be arranged or disposed in their display areas.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Provided is a display apparatus including a first area where various types of components may be arranged or disposed in a display area. Provided are embodiments thereof, however the embodiments of the disclosure are not limited thereto.

Additional aspects will be set forth in part in the description which follows and, in part, will be apparent from the description, or may be learned by practice of the presented embodiments of the disclosure.

According to one or more embodiments, provided is a display apparatus that may include a substrate comprising a first area, a display area surrounding the first area, and a non-display area surrounding the display area; a plurality of pixels disposed in the display area; scan lines extending in a first direction and disconnected in the first area; data lines extending in a second direction intersecting the first direction and disconnected in the first area; and data connection lines electrically connecting the data lines disconnected in the first area.

A predetermined number of the data connection lines may be disposed in the first area and extend in the second direction.

Each of the plurality of pixels may include a thin film transistor and a storage capacitor, the thin film transistor may include a semiconductor layer, a gate electrode overlapping the semiconductor layer, and a connection electrode electrically connected to the semiconductor layer, and the storage capacitor may include a lower electrode and an upper electrode overlapping the lower electrode.

The data lines and the connection electrode may be disposed at a same layer, and the data connection lines and the gate electrode may be disposed at a same layer.

The data lines and the data connection lines may be electrically connected through contact holes disposed in the display area.

The display apparatus may further include emission control lines extending in the first direction and disconnected in the first area.

The display apparatus may further include a plurality of insulating layers disposed in the display area, and at least one of the plurality of insulating layers may be disposed in the first area.

The display apparatus may further include a display device electrically connected to the thin film transistor and including a pixel electrode, an opposite electrode including a first hole corresponding to the first area, and an intermediate layer disposed between the pixel electrode and the opposite electrode.

The display apparatus may further include a thin film encapsulation layer disposed on the display device and including at least one inorganic encapsulation layer and at least one organic encapsulation layer.

The display apparatus may further include an input sensing section disposed on the thin film encapsulation layer and including sensing electrodes, trace lines electrically connected to the sensing electrodes, and a second hole corresponding to the first area.

The display apparatus may further include an optical functional section disposed on the input sensing section and including a third hole corresponding to the first area.

The data lines and the connection electrode may be disposed at a same layer, and the data connection lines and the upper electrode may be disposed at a same layer.

The display apparatus may further include a protection layer disposed on the data lines and the data connection lines, and the data lines and the data connection lines may be disposed at a same layer.

The data connection lines may bypass edges of the first area and may extend in the second direction.

The substrate may include polymer resin or glass.

The substrate may further include a second area separate from the first area, the data lines may be disconnected in the second area, and the data connection lines may electrically connect the data lines disconnected in the second area.

The display apparatus may further include a first scan connection line disposed in the first area and extending in the first direction, and the first scan connection line may electrically connect the scan lines disconnected in the first area.

The scan lines and the first scan connection line may be electrically connected through contact holes disposed in the display area.

The scan lines may be disconnected in the second area.

The display apparatus may further include a second scan connection line disposed in the second area and extending in the first direction, and the second scan connection line may electrically connect the scan lines disconnected in the second area.

The scan lines and the second scan connection line may be electrically connected through contact holes disposed in the display area.

The first scan connection line, and the second scan connection line, and the gate electrode may be disposed at a same layer.

The data connection lines and the upper electrode may be disposed at a same layer.

According to one or more embodiments, provided is a display apparatus that may include a substrate comprising a first area, a display area surrounding the first area, and a non-display area surrounding the display area; a component comprising an electronic element disposed in an area corresponding to the first area; scan lines extending in a first direction and disconnected in the first area; data lines extending in a second direction intersecting the first direction and disconnected in the first area; an opposite electrode disposed on the data lines and comprising a first hole corresponding to the first area; a thin film encapsulation layer disposed on the opposite electrode and comprising at least one inorganic encapsulation layer and at least one organic encapsulation layer; an input sensing section disposed on the thin film encapsulation layer and comprising a second hole corresponding to the first area; and an optical functional section disposed on the input sensing section and comprising a third hole corresponding to the first area.

The display apparatus may further include data connection lines that may electrically connect the data lines disconnected in the first area.

The component may include a sensor or an imaging device.

Other aspects, features, and advantages other than those described above will become apparent from the following detailed description, claims and drawings for carrying out the disclosure.

BRIEF DESCRIPTION OF THE DRAWINGS

The above and other aspects, features, and advantages of embodiments of the disclosure will be more apparent from the following description taken in conjunction with the accompanying drawings, in which:

FIG. 27 is a plan view of a portion of a display apparatus according to an embodiment.

DETAILED DESCRIPTION OF THE EMBODIMENTS

Figure 1:
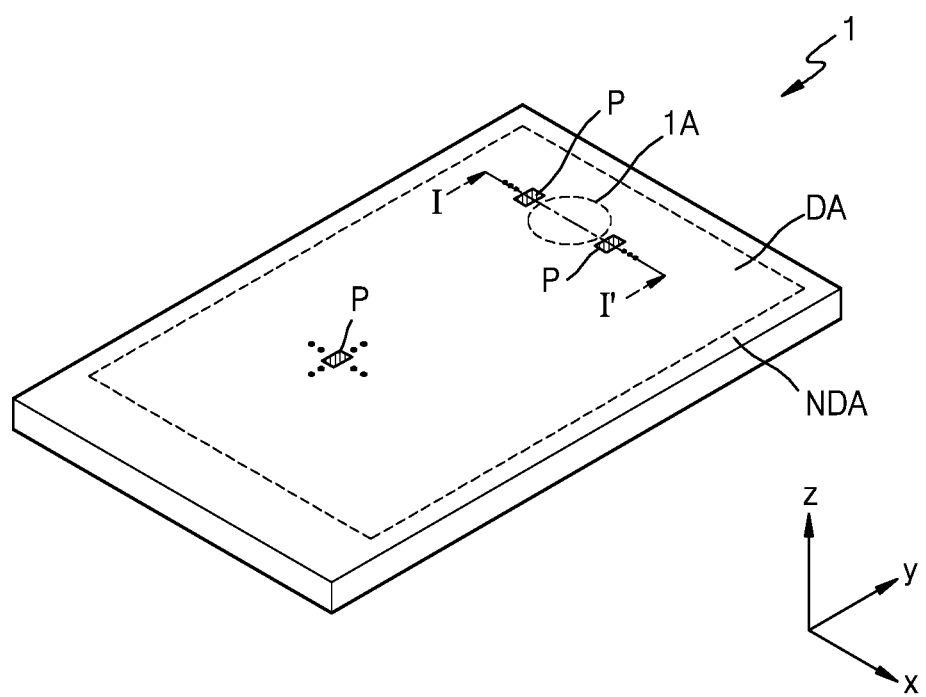
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Some of the parts which are not associated with the description may not be provided in order to describe embodiments of the disclosure and like reference numerals refer to like elements throughout the specification.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that although the terms "first," "second," etc. may be used herein to describe various components, these components should not be limited by these terms. These components are only used to distinguish one component from another. For example, a first element referred to as a first element in one embodiment may be referred to as a second element in another embodiment without departing from the scope of the appended claims.

As used herein, the singular forms "a," "an" and "the" are intended to include the plural forms as well, unless the context clearly indicates otherwise.

It will be further understood that the terms "comprises" and/or "comprising" "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Sizes of components in the drawings may be exaggerated for convenience of explanation. In other words, since sizes and thicknesses of components in the drawings are arbitrarily illustrated for convenience of explanation, the following embodiments are not limited thereto.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In the specification, an expression such as "A and/or B" indicates A, B, or A and B. Also, an expression such as "at least one of A and B" indicates A, B, or A and B.

In embodiments described below, the description that lines extend "in a first direction or a second direction" includes that the lines extend in a straight line and extend in a zigzag shape or a curved line.

In embodiments below, when a component is referred to as being "on a plane," it is understood that a component is viewed from the top, and when a component is referred to as being "on a schematic cross section," it is understood that the component is vertically cut and viewed from the side.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" or "electrically coupled" to another layer, region, or component, it may be "directly electrically connected" or "directly electrically coupled" to the other layer, region, or component and may be "indirectly electrically connected" or "indirectly electrically coupled" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are may not be perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, the embodiments of the disclosure will be described in detail with reference to the attached drawings, and like reference numerals in the drawings denote like reference elements.

FIG. 1 is a schematic perspective view of a display apparatus according to an embodiment.

Referring to FIG. 1, the display apparatus 1 may include a first area 1A, a display area DA surrounding or adjacent to the first area 1A, and a non-display area NDA surrounding or adjacent to the display area DA. The display apparatus 1 may provide images according to light emitted from pixels P arranged or disposed in the display area DA. The first area 1A may be entirely surrounded by the display area DA. The first area 1A may be an area where components to be described with reference to FIG. 2 may be arranged or disposed.

The display area DA may be surrounded by the non-display area NDA. The first area 1A and the non-display area NDA may be areas where no pixels may be arranged or disposed, and the non-display area NDA may be an area where images may not be displayed.

Hereinafter, it will be considered that the display apparatus 1 is an organic light-emitting display apparatus according to an embodiment, but one or more embodiments are not limited thereto. In an embodiment, the display apparatus 1 may be an inorganic light-emitting display (or an inorganic EL display) apparatus or a quantum dot light-emitting display apparatus. For example, an emission layer of a display device of the display apparatus 1 may include an organic material, an inorganic material, quantum dots, an organic material and quantum dots, or an inorganic material and quantum dots.

As shown in FIG. 1, the display apparatus 1 may include a flat display surface, but one or more embodiments are not limited thereto. In an embodiment, the display apparatus 1 may include a substantially cubic display surface or a substantially curved display surface.

In a case that the display apparatus 1 may include a substantially cubic display surface, the display apparatus 1 may include display areas oriented in different directions or may include, for example, display surfaces having substantially polygonal pillar shapes. In an embodiment, in a case that the display apparatus 1 may include a substantially curved display surface, the display apparatus 1 may be embodied as a flexible display apparatus, a foldable display apparatus, a rollable display apparatus, or the like within the spirit and the scope of the disclosure.

The display apparatus 1 shown in FIG. 1 may be applicable to a mobile terminal. Although not shown, electronic modules, camera modules, power modules, and the like, which may be embedded in a main board, may be arranged or disposed in a bracket/case, for example, together with the display apparatus 1, thereby forming a mobile terminal. The display apparatus 1 according to an embodiment may be applied to a large electronic apparatus such as a television or a monitor, a medium or small-sized electronic apparatus such as a tablet computer, an automobile navigation device, a game device, or a smart watch, or the like within the spirit and the scope of the disclosure.

As shown in FIG. 1, the display area DA of the display apparatus 1 has a rectangular shape, but the shape of the display area DA may be substantially in the form of a circle, an oval, or a polygon such as a triangle or a pentagon.

As shown in FIG. 1, the first area 1A is provided as a singular and a shape thereof is almost a circle, but one or more embodiments are not limited thereto. There may be at least two first areas 1A, and shapes of the at least two first areas 1A may vary, for example, a circle, an oval, a polygon, a star, a diamond, and the like within the spirit and the scope of the disclosure.

Figure 2:
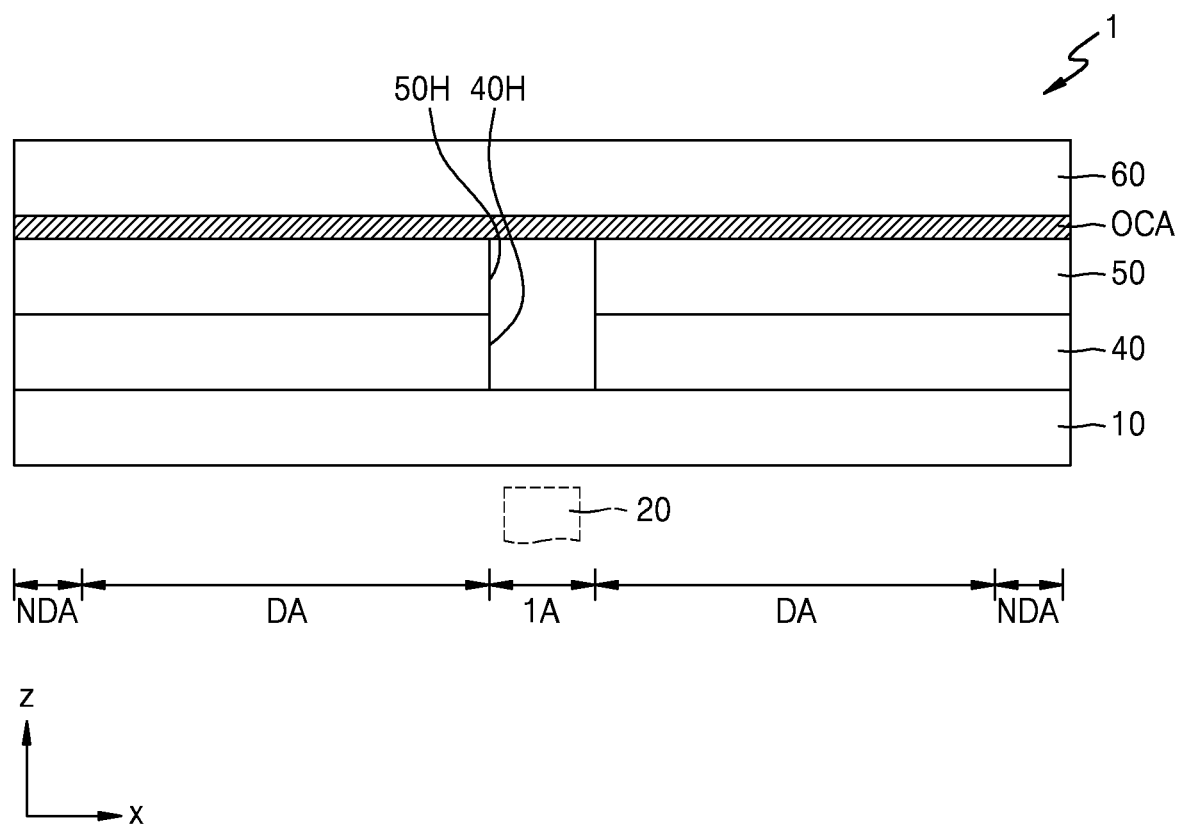
FIG. 2 is a schematic cross-sectional view of the display apparatus according to an embodiment.

FIG. 2 is a schematic cross-sectional view of the display apparatus according to an embodiment.

Referring to FIG. 2, the display apparatus 1 may include a display panel 10, an input sensing section 40 disposed on the display panel 10, and an optical functional section 50, and the aforementioned components may be covered or overlapped by a window 60. The window 60 may be connected or coupled to a component disposed thereunder or below, for example, the optical functional section 50, by an adhesive layer such as an optically clear adhesive OCA.

The display panel 10 may include display devices arranged or disposed in the display area DA. The input sensing section 40 may obtain coordinate information according to an external input, for example, a touch event. The input sensing section 40 may include a sensing electrode (or a touch electrode) and trace lines electrically connected thereto. The input sensing section 40 may be disposed on the display panel 10. The input sensing section 40 may sense an external input in a mutual-cap manner or a self-cap manner.

The input sensing section 40 may be directly formed on the display panel 10. Alternatively, the input sensing section 40 may be separately formed and then connected or coupled to the display panel 10 by an adhesive layer such as an OCA. In an embodiment, as shown in FIG. 2, the input sensing section 40 may be directly formed on the display panel 10, and in this case, the adhesive layer may not be disposed between the input sensing section 40 and the display panel 10.

The optical functional section 50 may include a reflection prevention layer. The reflection prevention layer may reduce the reflectivity of light (external light) that may be incident to the display panel 10 from the outside through the window 60. The reflection prevention layer may include a retarder and/or a polarizer. The retarder may be of a film type or a liquid-crystal coating type and may include a $\lambda/2$ retarder and/or a $\lambda/4$ retarder. The polarizer may also be a film type or a liquid-crystal coating type. The film type may include a stretched synthetic resin film, and the liquid-crystal coating type may include liquid crystals arranged or disposed in a predetermined array. The retarder and the polarizer may each include a protection film.

In an embodiment, the reflection prevention layer may include a black matrix and structures relating to color filters. The color filters may be arranged or disposed by considering colors of light respectively emitted from the pixels of the display panel 10. In an embodiment, the reflection prevention layer may include destructive interference structures. The destructive interference structures may include a first reflection layer and a second reflection layer arranged or disposed at different layers. First reflection light and second reflection light, which may be respectively reflected from the first reflection layer and the second reflection layer, may destructively interfere with each other, and the reflectivity of external light may decrease accordingly.

The optical functional section 50 may include a lens layer. The lens layer may improve the output efficiency of the light emitted from the display panel 10 or may decrease a difference of chromaticity. The lens layer may include a layer having a substantially convex or concave lens shape and/or may include layers of which refractive indices may be different. The optical functional section 50 may include both the reflection prevention layer and the lens layer or may include any one thereof.

Each of the input sensing section 40 and the optical functional section 50 may include a hole. For example, the input sensing section 40 may include a second hole 40H penetrating an upper surface and a lower surface of the input sensing section 40, and the optical functional section 50 may include a third hole 50H penetrating an upper surface and a lower surface of the optical functional section 50. The second hole 40H of the input sensing section 40 and the third hole 50H of the optical functional section 50 may be arranged or disposed corresponding to the first area 1A, and the second hole 40H of the input sensing section 40 and the third hole 50H of the optical functional section 50 may correspond to each other.

In a case that the adhesive layer between the window 60 and the optical functional section 50 may include an optical clear adhesive OCA, the adhesive layer may not include a hole corresponding to the first area 1A.

A component 20 may be located or disposed in the first area 1A. The component 20 may include an electronic component. For example, the component 20 may be an electronic component using light or sound. For example, the electronic component may include a sensor, for example, an infrared (IR) sensor, which receives and uses light, an imaging device that captures images by receiving light, a sensor that measures a distance or recognizes a fingerprint, for example, by outputting and detecting light or sound, a small lamp outputting light, a speaker outputting sound, or the like within the spirit and the scope of the disclosure. In the case of an electronic component using light, light in various bandwidths such as visible rays, infrared rays, or ultraviolet rays may be used. In an embodiment, the first area 1A may be a transmission area where light, which may be output from the component 20 to the outside or received from the outside to the electronic component, may transmit.

In an embodiment, in a case that the display apparatus 1 is used as a smart watch or a vehicle dashboard, the component 20 may be the hands of a clock or a component, for example, a hand, which indicates information (for example, speed of a vehicle, etc.). In a case that the display apparatus 1 may include hands of a clock or a vehicle dashboard, the component 20 may be exposed to the outside through the window 60, and the window 60 may include an opening corresponding to the first area 1A.

As described above, the component 20 may include a component (or components) that may add functions to the display apparatus 1, or may include components, for example, accessories, which may improve an aesthetic sense of the display panel 10.

Figure 3A:
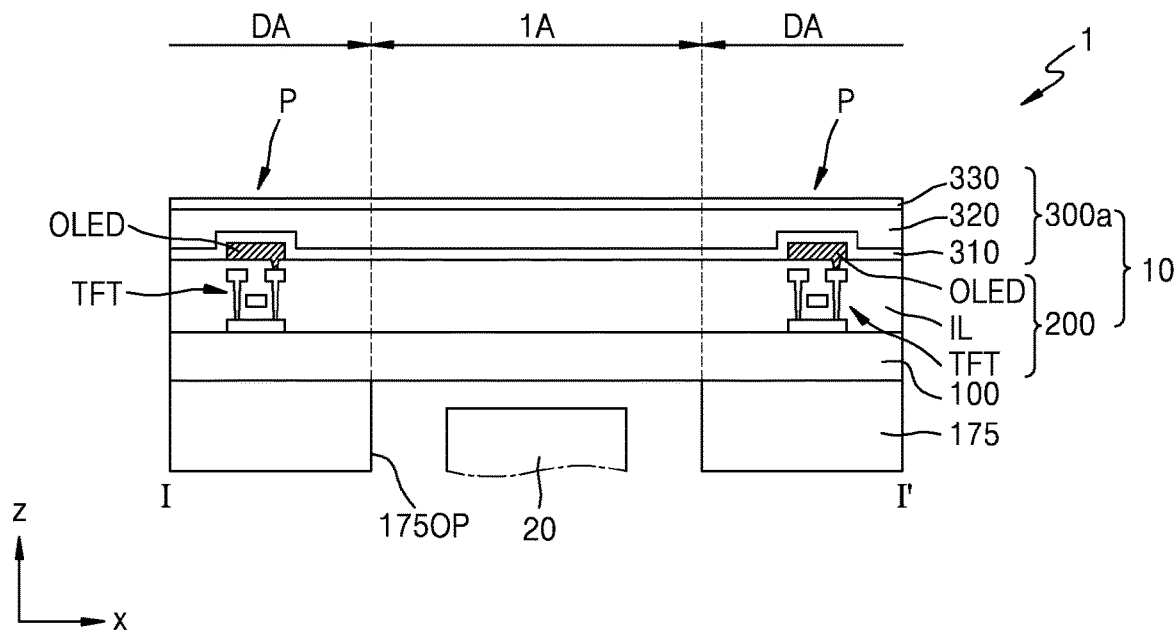
FIGS. 3A and 3B are schematic cross-sectional views of the display apparatus according to an embodiment.
Figure 3B:
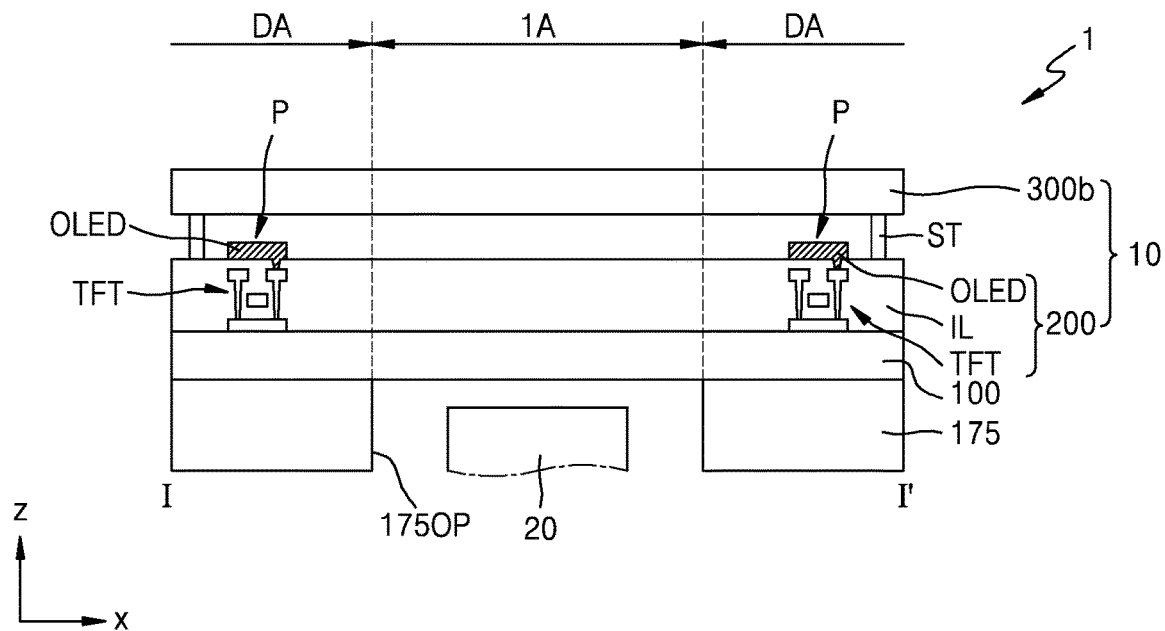

FIGS. 3A and 3B are schematic cross-sectional views of the display apparatus according to an embodiment.

Referring to FIG. 3A, the display apparatus 1 may include the display panel 10 including a display device and the component 20 disposed under or below the display panel 10 and corresponding to the first area 1A.

The display panel 10 may include a substrate 100, a display device layer 200 disposed on the substrate 100, and a thin film encapsulation layer 300a encapsulating the display device layer 200 as an encapsulation member. The display panel 10 may include a lower protection film 175 disposed under or below the substrate 100.

The substrate 100 may include glass or polymer resin. The polymer resin may include polyether sulfone, polyacrylate, polyether imide, polyethylene naphthalate, polyethylene terephthalate, polyphenylene sulfide, polyarylate, polyimide, polycarbonate, cellulose acetate propionate, or the like within the spirit and the scope of the disclosure. The substrate 100 including the polymer resin may have flexible, rollable, or bendable characteristics. The substrate 100 may have a structure in which a layer including the aforementioned polymer resin and an inorganic layer (not shown).

The display device layer 200 may include a pixel circuit including a thin film transistor TFT, an organic light-emitting diode OLED as a pixel device, and an insulating layer IL therebetween. In the display area DA, the pixel P including the thin film transistor TFT and the organic light-emitting diode OLED electrically connected to the thin film transistor TFT may be located or disposed.

The display device layer 200 may be covered or overlapped by the thin film encapsulation layer 300a. The thin film encapsulation layer 300a may include at least one inorganic encapsulation layer and at least one organic encapsulation layer. Regarding this, FIG. 3A shows a first inorganic encapsulation layer 310, a second inorganic encapsulation layer 330, and an organic encapsulation layer 320 therebetween.

The first inorganic encapsulation layer 310 and the second inorganic encapsulation layer 330 may each include one or more inorganic insulating materials selected from the group consisting of aluminum oxide ($Al_2O_3$), titanium oxide ($TiO_2$), tantalum oxide ($Ta_2O_5$), hafnium oxide ($HfO_2$), zinc oxide ($ZnO_2$), silicon oxide ($SiO_2$), silicon nitride ($SiN_x$), and silicon oxynitride (SiON). The organic encapsulation layer 320 may include a polymer-based material. Examples of the polymer-based material may include acryl-based resin, epoxy-based resin, polyimide, and polyethylene.

Referring to FIG. 3B, the display device layer 200 may be covered or overlapped by an encapsulation substrate 300b. The encapsulation substrate 300b may include a glass material. For example, the encapsulation substrate 300b may include a glass material having $SiO_2$ as a main component. The encapsulation substrate 300b may face or overlap the substrate 100, and sealants ST may be disposed between the substrate 100 and the encapsulation substrate 300b. The sealant ST may be disposed on edges of the substrate 100 and may surround the entire display device layer 200 between the substrate 100 and the encapsulation substrate 300b. In a case that the display apparatus 1 is viewed in a direction perpendicular to an upper surface of the substrate 100 (or on a plan view), the first area 1A and display area DA may be entirely surrounded by the sealants ST.

A lower protection film 175 may be attached to the bottom of the substrate 100 and may support and protect the substrate 100. The lower protection film 175 may include an opening 175OP corresponding to the first area 1A. As the lower protection film 175 may include the opening 175OP, the light transmittance of the first area 1A may be improved. The lower protection film 175 may include polyethylene terephthalate or polyimide.

In an embodiment, an area of the first area 1A may be greater than that of an area where the component 20 may be located or disposed. Accordingly, an area of the opening 175OP of the lower protection film 175 may not be identical to the area of the first area 1A. For example, the area of the opening 175OP may be less than that of the first area 1A.

Figure 4:
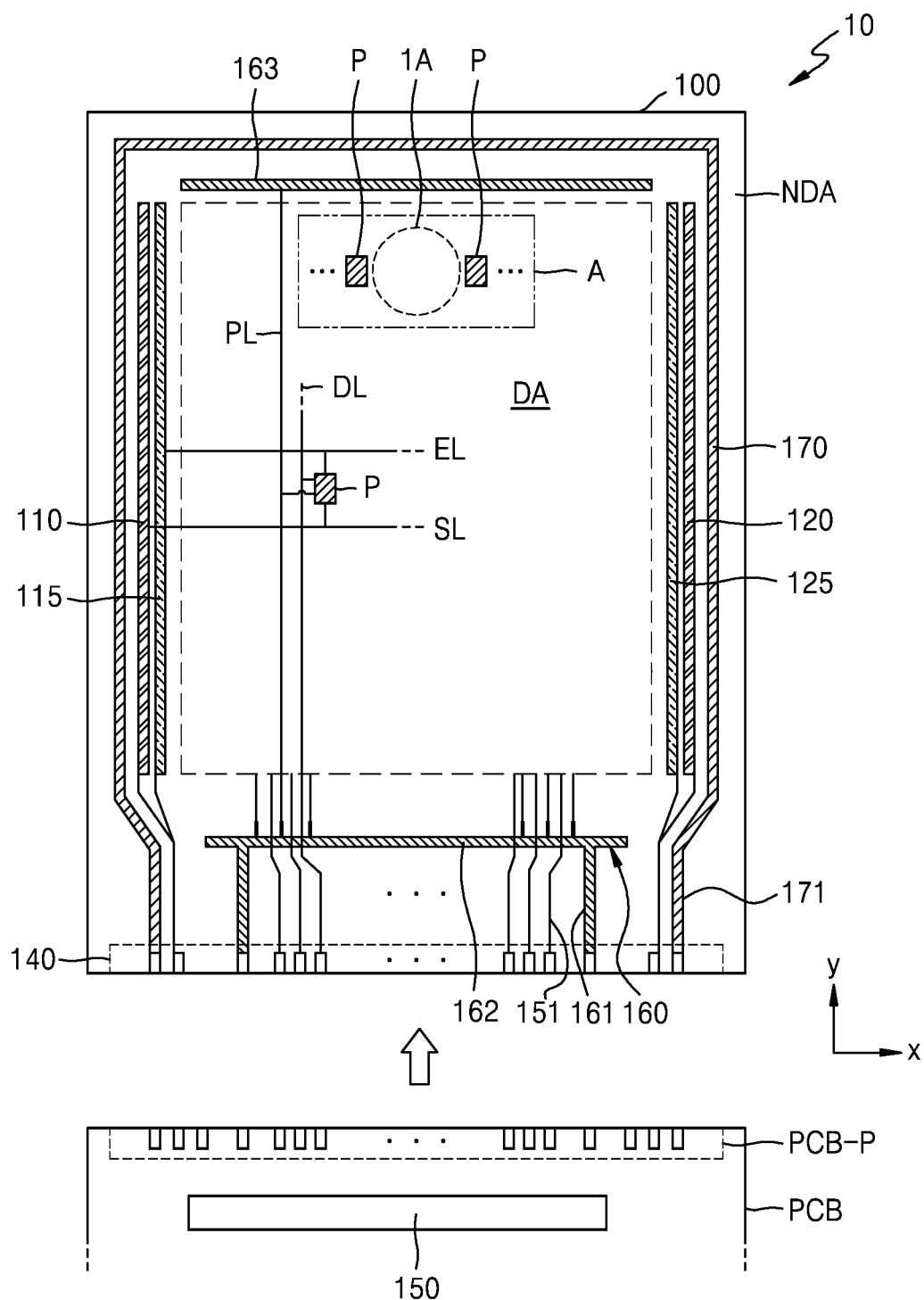
FIG. 4 is a schematic plan view of a display apparatus according to an embodiment.

FIG. 4 is a schematic plan view of the display panel according to an embodiment.

Referring to FIG. 4, components forming the display panel 10 may be disposed on the substrate 100. The substrate 100 may include the first area 1A, the display area DA surrounding the first area 1A, and the non-display area NDA surrounding the display area DA. The first area 1A and the display area DA may be covered or overlapped by the encapsulation member described with reference to FIGS. 3A and 3B and thus may be protected from external air, moisture, or the like within the spirit and the scope of the disclosure.

The display panel 10 may include pixels P arranged or disposed in the display area DA. Each pixel P may include a display device such as an organic light-emitting diode. Each pixel P may emit, for example, red light, green light, blue light, or white light through the organic light-emitting diode. In the specification, as described above, the pixel P may be understood as a pixel emitting light of any one of colors such as red, green, blue, and white.

The first area 1A may be surrounded by the display area DA. Corresponding to a bottom portion of the first area 1A of the display panel 10, at least one component 20 may be disposed. The pixels P may not be disposed in the first area 1A. As shown in FIG. 4, the first area 1A is provided as a singular and has a substantially circular shape, but one or more embodiments are not limited thereto. There may be two first areas 1A, and a shape of each first area 1A may be substantially in the form of a circle, an oval, a polygon, a star, a diamond, or the like within the spirit and the scope of the disclosure.

Each pixel P may be electrically connected to outer circuits arranged or disposed in the non-display area NDA. In the non-display area NDA, a first scan driving circuit 110, a first emission driving circuit 115, a second scan driving circuit 120, a second emission driving circuit 125, a terminal 140, a data driving circuit 150, a first power supply line 160, and a second power supply line 170 may be arranged or disposed.

The first scan driving circuit 110 and the second scan driving circuit 120 may provide scan signals to the pixels P, respectively, through scan lines SL. The first emission driving circuit 115 and the second emission driving circuit 125 may provide emission control signals to the pixels P, respectively, through emission control lines EL. The second scan driving circuit 120 may be arranged or disposed in parallel with the first scan driving circuit 110 with the display area DA therebetween, and the second emission driving circuit 125 may be arranged or disposed in parallel with the first emission driving circuit 115 with the display area DA therebetween. Some or a predetermined number of the pixels P arranged or disposed in the display area DA may be electrically connected to the first scan driving circuit 110, and others thereof may be electrically connected to the second scan driving circuit 120. Some or a predetermined number of the pixels P arranged or disposed in the display area DA may be electrically connected to the first emission driving circuit 115, and others thereof may be electrically connected to the second emission driving circuit 125.

The first emission driving circuit 115 may be apart from the first scan driving circuit 110 in a first direction (an x direction) and disposed in the non-display area NDA. In an embodiment, the first emission driving circuit 115 and the first scan driving circuit 110 may be alternately arranged or disposed in a second direction (a y direction) crossing or intersecting the first direction (the x direction).

The terminal 140 may be disposed on a side of the substrate 100. Exposed to the outside without being covered or overlapped by an insulation layer, the terminal 140 may be electrically connected to a printed circuit board PCB. A terminal PCB-P of the printed circuit board PCB may be electrically connected to the terminal 140 of the display apparatus 1. The printed circuit board PCB may transmit signals or power of a controller (not shown) to the display panel 10. Control signals generated in the controller may be respectively transmitted to the first scan driving circuit 110, the first emission driving circuit 115, the second scan driving circuit 120, and the second emission driving circuit 125 through the printed circuit board PCB. The controller may provide a first power voltage ELVDD to the first power supply line 160 through a first connection line 161 and a second power voltage ELVSS to the second power supply line 170 through a second connection line 171. The first power voltage ELVDD may be provided to the pixel P through a driving voltage line PL electrically connected to the first power supply line 160, and the second power voltage ELVSS may be provided to an opposite electrode of the pixel P electrically connected to the second power supply line 170.

The data driving circuit 150 may be electrically connected to a data line DL. Data signals of the data driving circuit 150 may be provided to the pixels P through a connection line 151 electrically connected to the terminal 140 and the data line DL electrically connected to the connection line 151. As shown in FIG. 4, the data driving circuit 150 may be disposed on the PCB, but in an embodiment, the data driving circuit 150 may be disposed on the substrate 100. For example, the data driving circuit 150 may be disposed between the terminal 140 and the first power supply line 160.

The first power supply line 160 may include a first sub-line 162 and a second sub-line 163 that may extend in parallel along the first direction (the x direction) with the display area DA therebetween. The second power supply line 170 may partially surround the display area DA in a substantially loop shape of which one side may be open.

Figure 5:
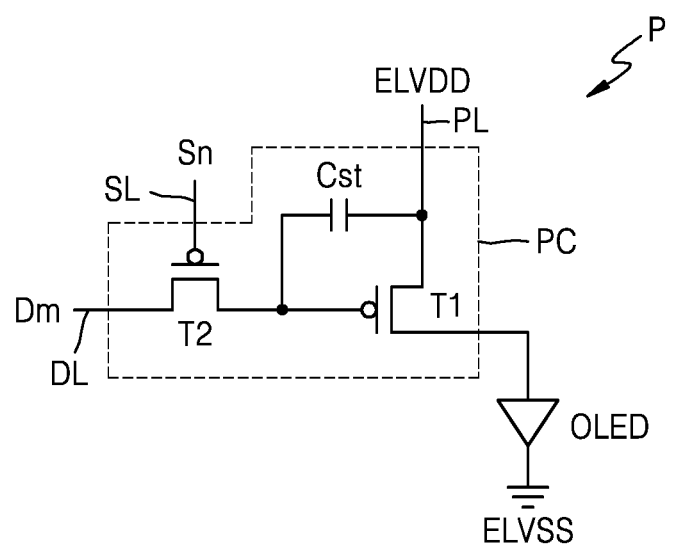
FIGS. 5 and 6 are schematic equivalent circuit diagrams showing a pixel included in a display panel, according to an embodiment.
Figure 6:
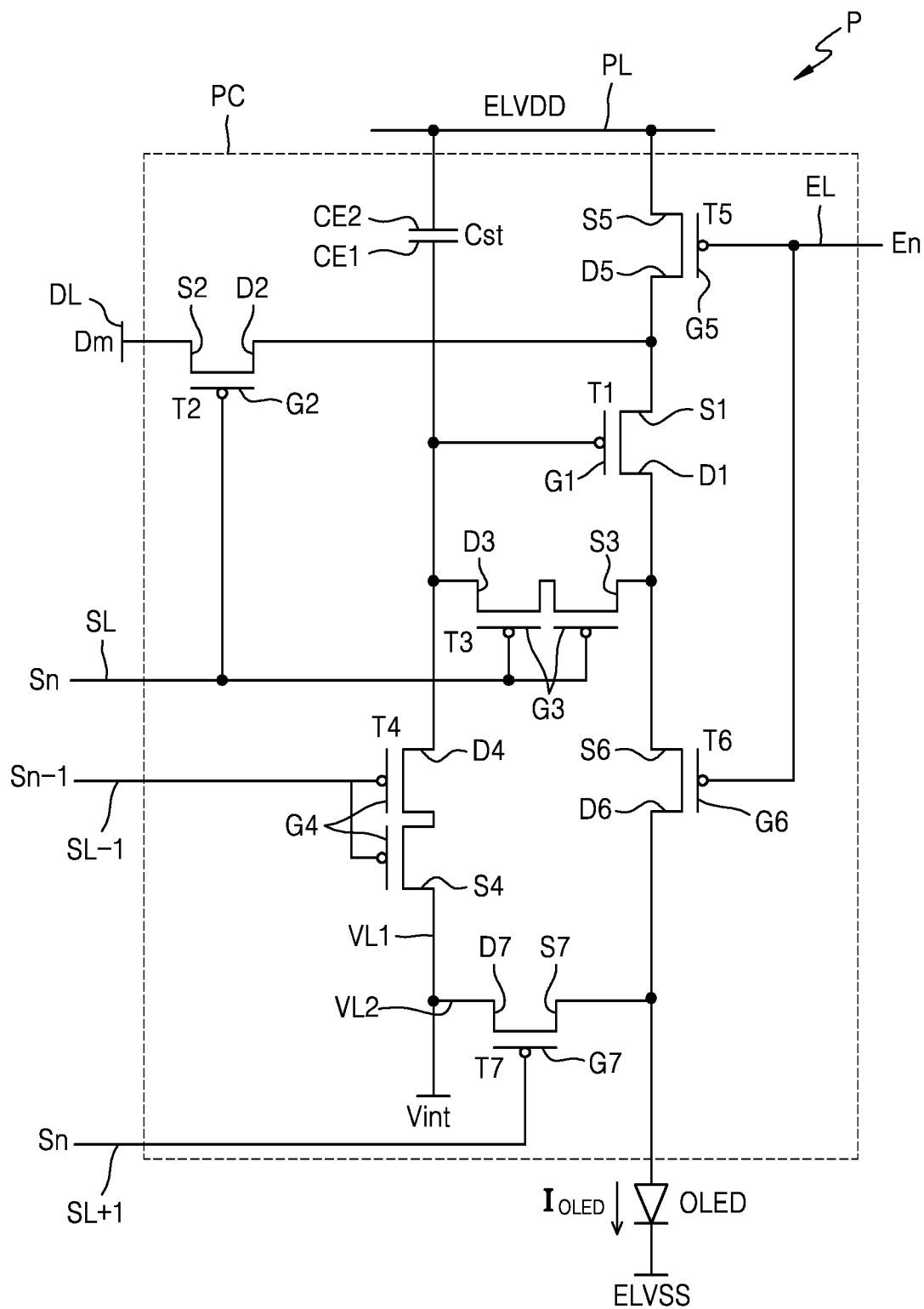

FIGS. 5 and 6 are schematic equivalent circuit diagrams of any one of the pixels in the display panel, according to an embodiment.

Referring to FIG. 5, the pixel P may include a pixel circuit PC electrically connected to the scan line SL and the data line DL and the organic light-emitting diode OLED electrically connected to the pixel circuit PC.

The pixel circuit PC may include a driving thin film transistor T1, a switching thin film transistor T2, and a storage capacitor Cst. The switching thin film transistor T2 may be electrically connected to the scan line SL and the data line DL and transmit a data signal Dm, which may be input through the data line DL, to the driving thin film transistor T1 in response to a scan signal Sn input through the scan line SL.

The storage capacitor Cst may be electrically connected to the switching thin film transistor T2 and the driving power line PL and stores a voltage corresponding to a difference between a voltage from the switching thin film transistor T2 and the first power voltage (ELVDD or a driving voltage) supplied to the driving power line PL.

The driving thin film transistor T1 may be electrically connected to the driving power line PL and the storage capacitor Cst and may control a driving current flowing through the organic light-emitting diode OLED from the driving power line PL according to a value of the voltage stored in the storage capacitor Cst. The organic light-emitting diode OLED may emit light having certain brightness by a driving current.

As shown in FIG. 5, the pixel circuit PC may include two thin film transistors and one storage capacitor, but one or more embodiments are not limited thereto. As shown in FIG. 6, the pixel circuit PC may include seven thin film transistors and one storage capacitor.

Referring to FIG. 6, the pixel P may include the pixel circuit PC and the organic light-emitting diode OLED electrically connected to the pixel circuit PC. The pixel circuit PC may include thin film transistors (T1 to T7) and the storage capacitor Cst. The thin film transistors (T1 to T7) and the storage capacitor Cst may be electrically connected to signal lines SL, SL−1, SL+1, EL and DL, a first initialization voltage line VL1, a second initialization voltage line VL2, and the driving power line PL.

The signal lines SL, SL−1, SL+1, EL and DL may include the scan line SL transmitting the scan signal Sn, the previous scan line SL−1 transmitting a previous scan signal Sn-1 to the first initialization thin film transistor T4, the subsequent scan line SL+1 transmitting the scan signal Sn to the second initialization thin film transistor T7, the emission control line EL transmitting an emission control signal En to the driving control thin film transistor T5 and the emission control thin film transistor T6, and the data line DL transmitting the data signal Dm and crossing or intersecting the scan line SL. The driving voltage line PL may transmit the driving voltage ELVDD to the driving thin film transistor T1, the first initialization voltage line VL1 may transmit an initialization voltage Vint to the first initialization thin film transistor T4, and the second initialization voltage line VL2 may transmit the initialization voltage Vint to the second initialization thin film transistor T7.

A driving gate electrode G1 of the driving thin film transistor T1 may be electrically connected to a lower electrode CE1 of the storage capacitor Cst, a driving source electrode S1 of the driving thin film transistor T1 may be electrically connected to a lower driving voltage line PL via the driving control thin film transistor T5, and a driving drain electrode D1 of the driving thin film transistor T1 may be electrically connected to the pixel electrode of the organic light-emitting diode OLED via the emission control thin film transistor T6. The driving thin film transistor T1 may receive the data signal Dm and provide a driving current $I_{OLED}$ to the organic light-emitting diode OLED according to a switching operation of the switching thin film transistor T2.

A switching gate electrode G2 of the switching thin film transistor T2 may be electrically connected to the scan line SL, a switching source electrode S2 of the switching thin film transistor T2 may be electrically connected to the data line DL, and a switching drain electrode D2 of the switching thin film transistor T2 may be electrically connected to the driving source electrode S1 of the driving thin film transistor T1 and electrically connected to the lower driving voltage line PL via the driving control thin film transistor T5. The switching thin film transistor T2 may be turned on in response to the scan signal Sn transmitted through the scan line SL and perform a switching operation of transmitting the data signal Dm, which may be transmitted to the data line DL, to the driving source electrode S1 of the driving thin film transistor T1.

A compensation gate electrode G3 of the compensation thin film transistor T3 may be electrically connected to the scan line SL, a compensation source electrode S3 of the compensation thin film transistor T3 may be electrically connected to the driving drain electrode D1 of the driving thin film transistor T1 and to the pixel electrode of the organic light-emitting diode OLED via the emission control thin film transistor T6, and a compensation drain electrode D3 of the compensation thin film transistor T3 may be electrically connected to the lower electrode CE1 of the storage capacitor Cst, the first initialization drain electrode D4 of the first initialization thin film transistor T4, and the driving gate electrode G1 of the driving thin film transistor T1. The compensation thin film transistor T3 may be turned on in response to the scan signal Sn transmitted through the scan line SL and diode-connects the driving thin film transistor T1 by electrically connecting the driving gate electrode G1 and the driving drain electrode D1 of the driving thin film transistor T1.

A first initialization gate electrode G4 of the first initialization thin film transistor T4 may be electrically connected to the previous scan line SL−1, a first initialization source electrode S4 of first initialization thin film transistor T4 may be electrically connected to the first initialization voltage line VL1, and a first initialization drain electrode D4 of the first initialization thin film transistor T4 may be electrically connected to the lower electrode CE1 of the storage capacitor Cst, the compensation drain electrode D3 of the compensation thin film transistor T3, and the driving gate electrode G1 of the driving thin film transistor T1. The first initialization thin film transistor T4 may be turned on in response to the previous scan signal Sn−1 transmitted through the previous scan line SL−1 and may transmit the initialization voltage Vint to the driving gate G1 of the driving thin film transistor T1, thereby performing an initialization operation of initializing a voltage of the driving gate electrode G1 of the driving thin film transistor T1.

A driving control gate electrode G5 of the driving control thin film transistor T5 may be electrically connected to the emission control line EL, a driving control source electrode S5 of the driving control thin film transistor T5 may be electrically connected to the lower driving voltage line PL, and a driving control drain electrode D5 of the driving control thin film transistor T5 may be electrically connected to the driving source electrode S1 of the driving thin film transistor T1 and the switching drain electrode D2 of the switching thin film transistor T2.

An emission control gate electrode G6 of the emission control thin film transistor T6 may be electrically connected to the emission control line T6, an emission control source electrode S6 of the emission control thin film transistor T6 may be electrically connected to the driving drain electrode D1 of the driving thin film transistor T1 and the compensation source electrode S3 of the compensation thin film transistor T3, and an emission control drain electrode D6 of the emission control thin film transistor T6 may be electrically connected to the second initialization source electrode S7 of the second initialization thin film transistor T7 and the pixel electrode of the organic light-emitting diode OLED.

The driving control thin film transistor T5 and the emission control thin film transistor T6 may be simultaneously turned on in response to the emission control signal En transmitted through the emission control line EL, and the driving voltage ELVDD may be transmitted to the organic light-emitting diode OLED. Thus, the driving current $I_{OLED}$ may flow in the organic light-emitting diode OLED.

A second initialization gate electrode G7 of the second initialization thin film transistor T7 may be electrically connected to the subsequent scan line SL+1, a second initialization source electrode S7 of the second initialization thin film transistor T7 may be electrically connected to the emission control drain electrode D6 of the emission control thin film transistor T6 and the pixel electrode of the organic light-emitting diode OLED, and a second initialization drain electrode D7 of the second initialization thin film transistor T7 may be electrically connected to the second initialization voltage line VL2.

As the scan line SL and the subsequent scan line SL+1 may be electrically connected to each other, identical scan signals Sn may be transmitted to the scan line SL and the subsequent scan line SL+1. Therefore, the second initialization thin film transistor T7 may be turned on in response to the scan signal Sn transmitted through the subsequent scan line SL+1 and may perform an operation of initializing the pixel electrode of the organic light-emitting diode OLED.

The upper electrode CE2 of the storage capacitor Cst may be electrically connected to the driving power line PL, and a common electrode of the organic light-emitting diode OLED may be electrically connected to a common voltage ELVSS. Accordingly, the driving current $I_{OLED}$ may be transmitted from the driving thin film transistor T1 to the organic light-emitting diode OLED, and thus an image or images may be displayed.

FIG. 6 shows that the compensation thin film transistor T3 and the first initialization thin film transistor T4 have dual gate electrodes, but the compensation thin film transistor T3 and the first initialization thin film transistor T4 may have one gate electrode.

Figure 7:
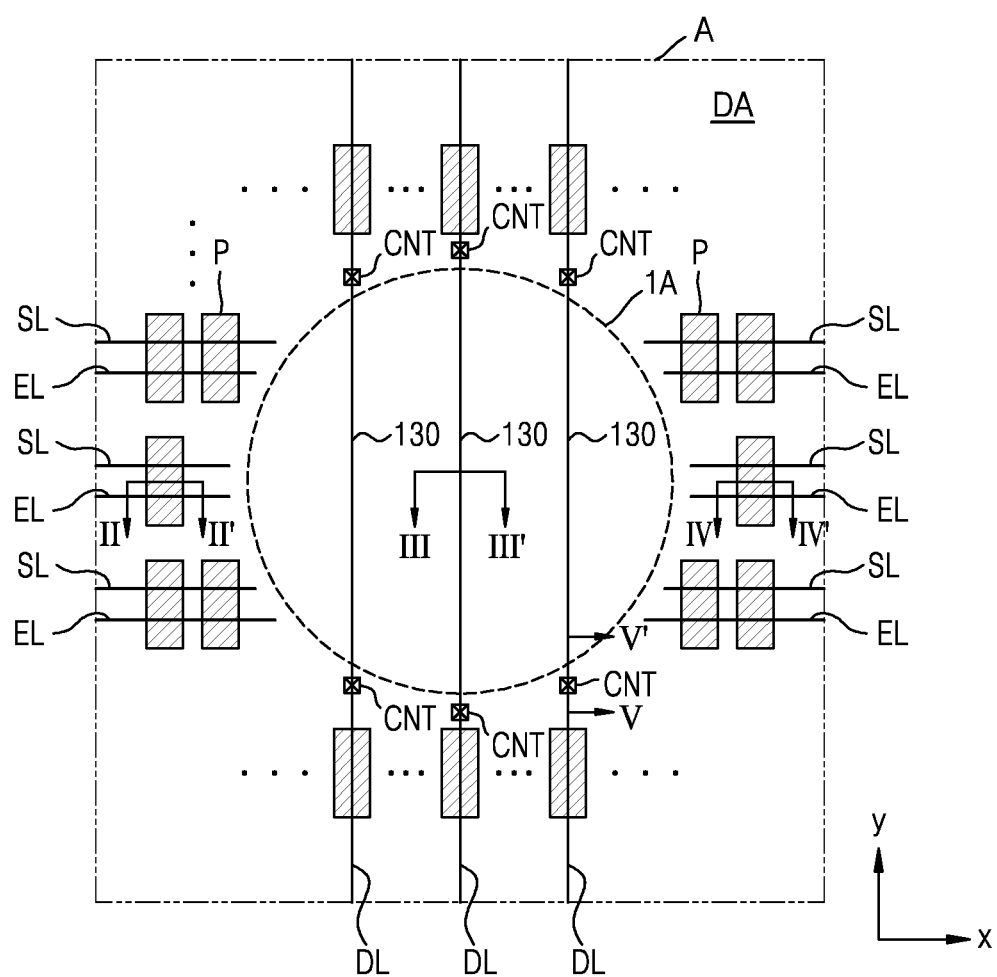
FIG. 7 is a plan view of a portion of a display apparatus according to an embodiment.

FIG. 7 is a plan view of a portion or region of the display apparatus according to an embodiment. In more detail, FIG. 7 is a plan view showing an enlarged portion or region A of FIG. 4.

Referring to FIG. 7, the display apparatus 1 according to an embodiment may include the first area 1A and the display area DA surrounding the first area 1A. The pixels P may be arranged or disposed in the display area DA.

The scan lines SL and the emission control lines EL may be arranged or disposed in the display area DA. The scan lines SL may respectively provide the scan signals to the pixels P, may extend in the first direction (the x direction), and may be disconnected in the first area 1A therebetween. The emission control lines EL may respectively provide the emission control signals to the pixels P, may extend in the first direction (the x direction), and may be disconnected in the first area 1A therebetween. In an embodiment, since the scan lines SL and the emission control lines EL may be disconnected in the first area 1A therebetween, as shown in FIG. 4, the pixels P on the left side of the first area 1A may receive the scan signals through the scan lines SL electrically connected to the first scan driving circuit 110 and may receive the emission control signals through the emission control lines EL electrically connected to the first emission driving circuit 115. The pixels P on the right side of the first area 1A may receive the scan signals through the scan lines SL electrically connected to the second scan driving circuit 120 and may receive the emission control signals through the emission control lines EL electrically connected to the second emission driving circuit 125.

The data lines DL may be arranged or disposed in the display area DA. The data lines DL may respectively provide the data signals to the pixels P, may extend in the second direction (the y direction) crossing or intersecting the first direction (the x direction), and may be disconnected in the first area 1A therebetween. The data lines DL, which may be disconnected in the first area 1A therebetween, may be arranged or disposed in the first area 1A and may be electrically connected by data connection lines 130 extending in the second direction (they direction).

The data lines DL and the data connection lines 130 may be electrically connected to each other by contact holes CNT, and the contact holes CNT electrically connecting the data lines DL and the data connection lines 130 may be disposed in the display area DA.

Figure 8:
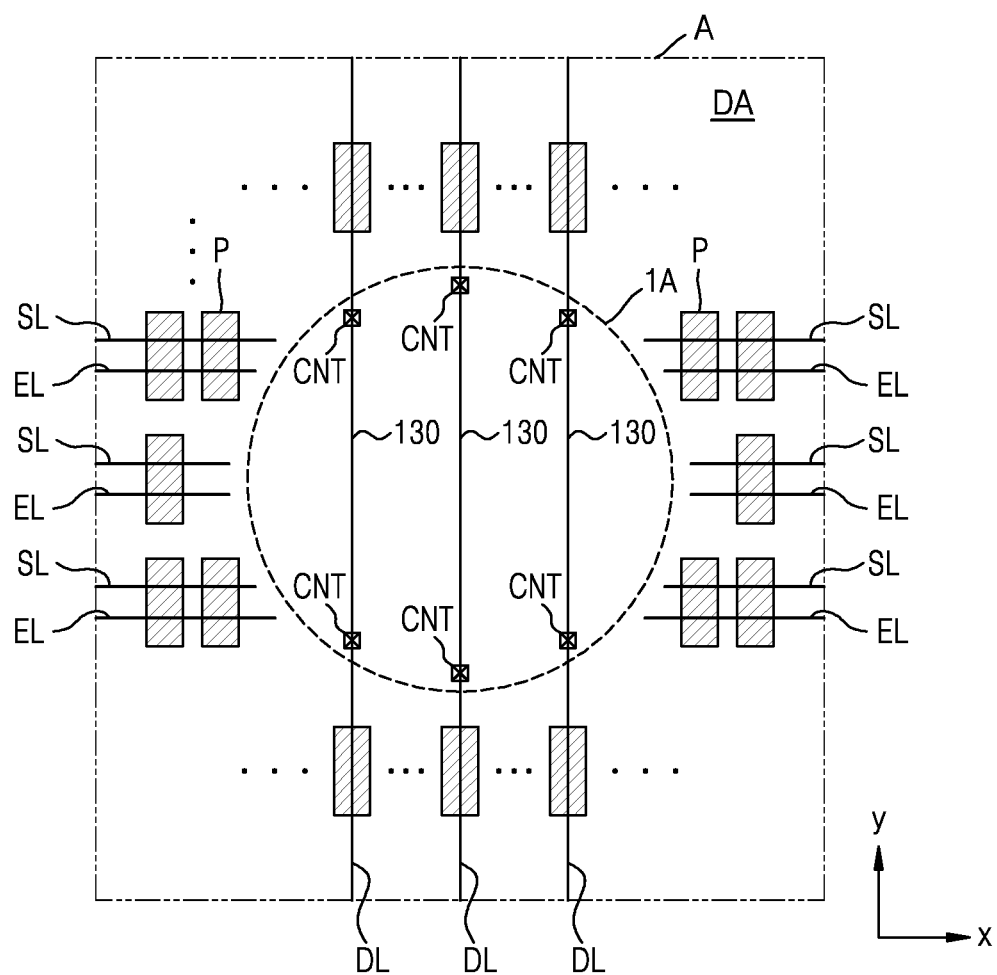
FIG. 8 is a plan view of a portion of a display apparatus according to an embodiment.

FIG. 8 is a plan view of a portion or region of the display apparatus according to an embodiment.

The embodiment of FIG. 8 may differ from that of FIG. 7 in that the contact holes CNT electrically connecting the data lines DL and the data connection lines 130 may be located or disposed in the first area 1A. Structures of FIG. 8, which may be identical to those of FIG. 7, will not be described again, and a difference therebetween will be mainly described hereinafter.

Referring to FIG. 8, the display apparatus 1 according to an embodiment may include the first area 1A and the display area DA surrounding the first area 1A. The pixels P may be arranged or disposed in the display area DA.

In the display area DA, the scan lines SL, the emission control lines EL, and the data lines DL may be arranged or disposed. The scan lines SL may respectively provide the scan signals to the pixels P, may extend in the first direction (the x direction), and may be disconnected in the first area 1A therebetween. The emission control lines EL may respectively provide the emission control signals to the pixels P, may extend in the first direction (the x direction), and may be disconnected in the first area 1A therebetween. The data lines DL may respectively provide the data signals to the pixels P, may extend in the second direction (the y direction) crossing or intersecting the first direction (the x direction), and may be disconnected in the first area 1A therebetween. The data lines DL, which may be disconnected in the first area 1A therebetween, may be arranged or disposed in the first area 1A and may be electrically connected by the data connection lines 130 extending in the second direction (the y direction). The data lines DL and the data connection lines 130 may be electrically connected through the contact holes CNT, and the contact holes CNT electrically connecting the data lines DL and the data connection lines 130 may be located or disposed in the first area 1A.

Figure 9:
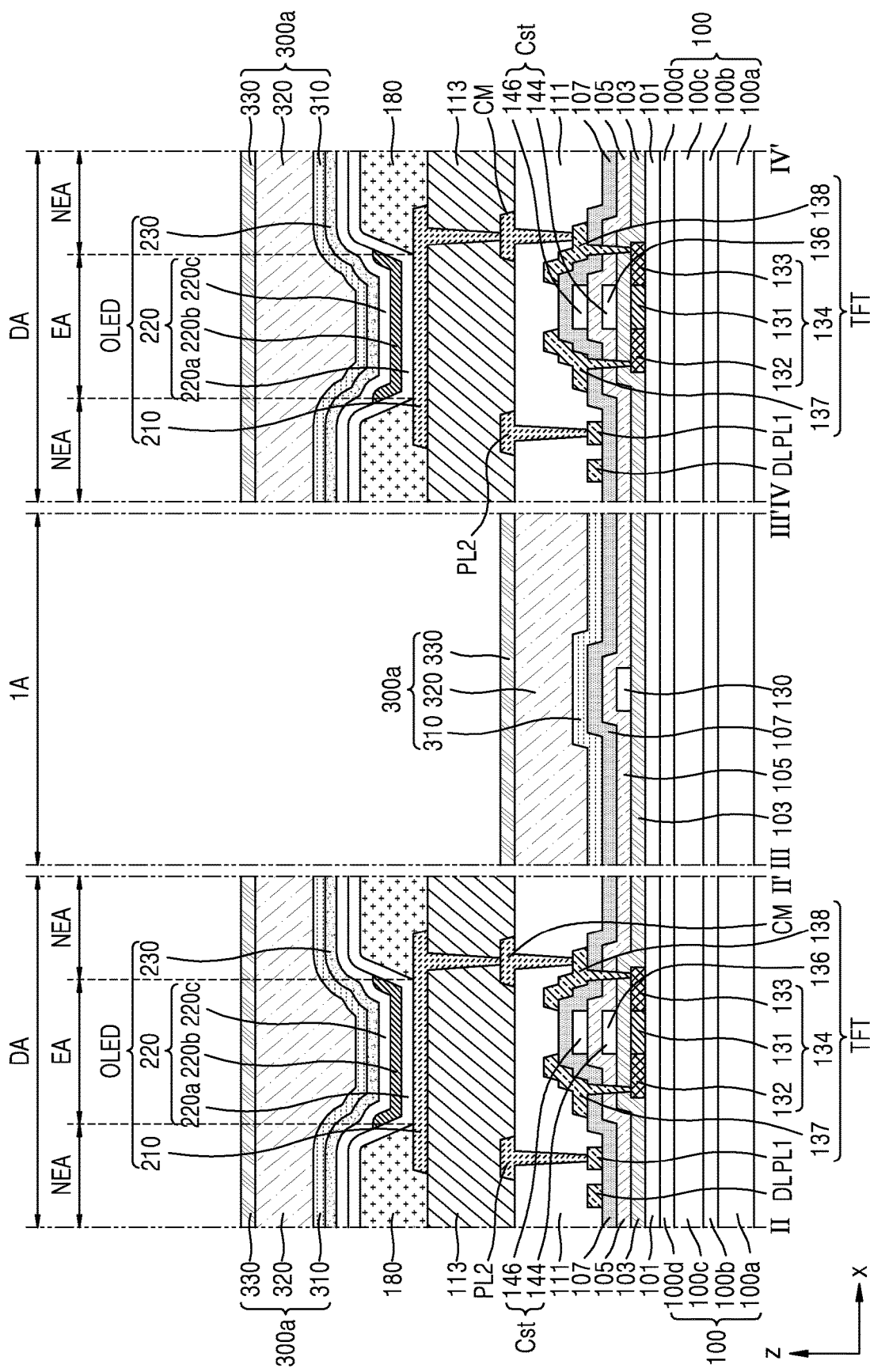
FIG. 9 is a schematic cross-sectional view of a portion of a display apparatus according to an embodiment.
Figure 10:
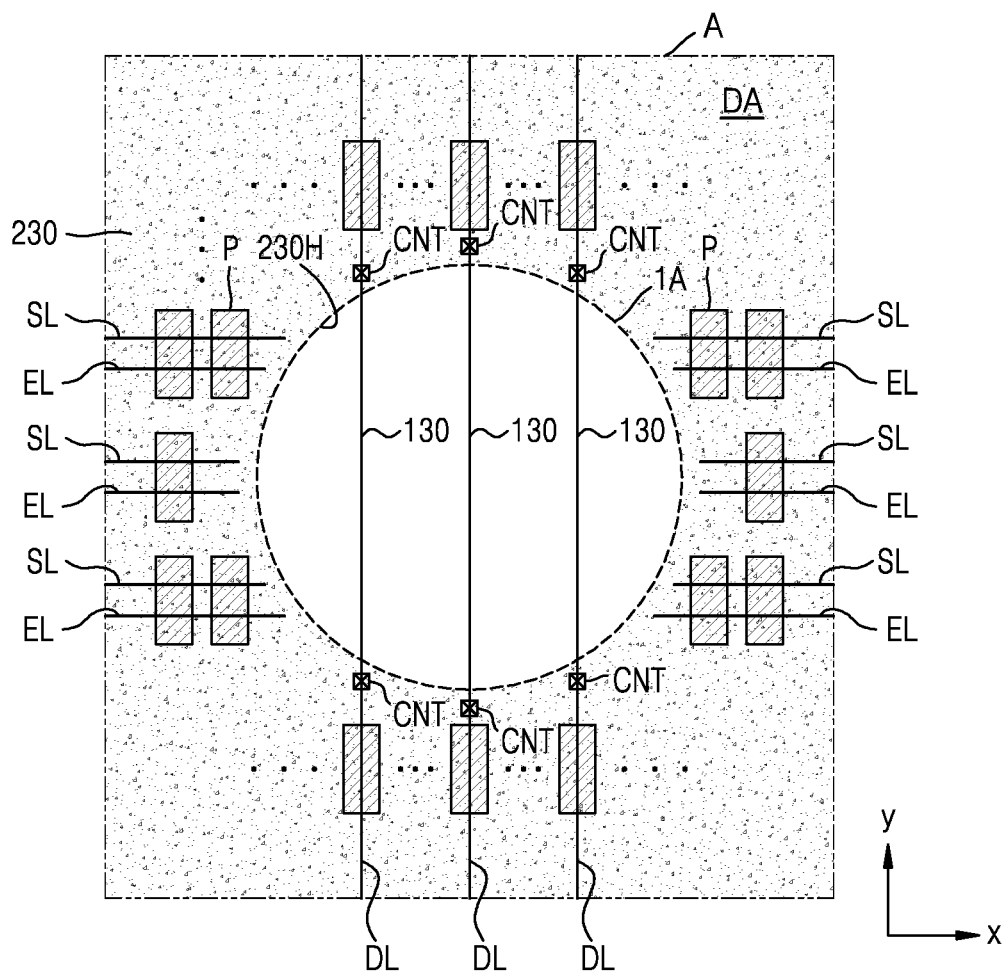
FIG. 10 is a plan view of a portion of a display apparatus according to an embodiment.
Figure 11:
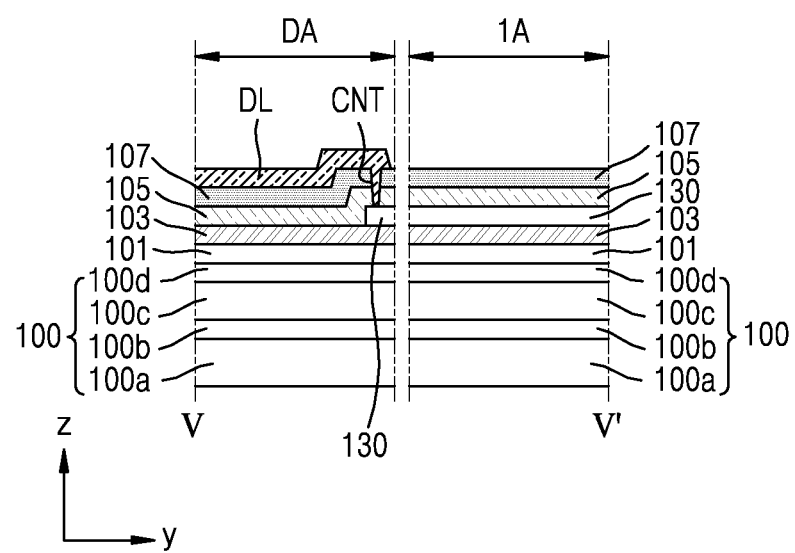
FIG. 11 is a schematic cross-sectional view of a portion of a display apparatus according to an embodiment.

FIG. 9 is a schematic cross-sectional view of a portion or region of the display apparatus according to an embodiment, FIG. 10 is a plan view of a portion or region of a display apparatus according to an embodiment, and FIG. 11 is a schematic cross-sectional view of a portion or region of the display apparatus according to an embodiment.

In more detail, FIG. 9 is a schematic cross-sectional view of the display apparatus, taken along lines and II-II', III-III', IV'-IV' of FIG. 7, FIG. 10 is a plan view for explaining the opposite electrode including the first hole corresponding to the first area, and FIG. 11 is a schematic cross-sectional view of the display apparatus, taken along a line V-V' of FIG. 7.

Referring to FIG. 9, the substrate 100 may include polymer resin. As the substrate 100 may include polymer resin, the display apparatus 1 may have flexible, rollable, or bendable characteristics. In an embodiment, the substrate 100 may include a first substrate 100a, a first barrier layer 100b disposed on the first substrate 100a, a second substrate 100c disposed on the first barrier layer 100b, and a second barrier layer 100d disposed on the second substrate 100c.

A buffer layer 101 may be disposed on the substrate 100 in the display area DA. The buffer layer 101 may be disposed on the substrate 100 and may decrease or prevent penetration of impurities, moisture, or external air from the bottom of the substrate 100, thus providing a substantially flat surface on the substrate 100. The buffer layer 101 may include an inorganic material such as oxide or nitride, an organic material, or a composite of organic/inorganic materials, and may have a single-layer structure or a multilayered structure including inorganic and organic materials.

The thin film transistor TFT may be disposed on the buffer layer 101 in the display area DA. The thin film transistor TFT may include a semiconductor layer 134, a gate electrode 136 overlapping the semiconductor layer 134, and a connection electrode electrically connected to the semiconductor layer 134. The thin film transistor TFT may be electrically connected to the organic light-emitting diode OLED and may drive the same.

The semiconductor layer 134 may be disposed on the buffer layer 101 and may include a channel area 131 overlapping the gate electrode 136 and source and drain areas 132 and 133 that may be disposed on both sides of the channel area 131 and have impurities having a higher concentration than those in the channel area 131. Here, the impurities may include N-type or P-type impurities. The source area 132 and the drain area 133 may be electrically connected to the connection electrode.

The semiconductor layer 134 may include an oxide semiconductor and/or a silicon semiconductor. In a case that the semiconductor layer 134 may include an oxide semiconductor, the semiconductor layer 134 may include, for example, at least one oxide selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the semiconductor layer 134 may include InSnZnO (ITZO), InGaZnO (IGZO), or the like within the spirit and the scope of the disclosure. In a case that the semiconductor layer 134 may include a silicon semiconductor, the semiconductor layer 134 may include, for example, amorphous silicon (a-Si), low temperature polysilicon (LTPS) crystallizing a-Si.

A first insulating layer 103 may be disposed on the semiconductor layer 134 of the display area DA. The first insulating layer 103 may include at least one inorganic insulating material selected from the group consisting of $SiO_2$, $SiN_x$, SiON, $Al_2O_3$, $TiO_2$, $Ta_2O_5$, $HfO_2$, or $ZnO_2$. The first insulating layer 103 may include a monolayer or multilayers including the above inorganic insulating material(s).

On the first insulating layer 103 of the display area DA, the gate electrodes 136 may be disposed. The gate electrode 136 may include at least one metal selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrodes 136 may be electrically connected to gate lines transmitting electrical signals to the gate electrodes 136.

On the gate electrodes 136 of the display area DA, a second insulating layer 105 may be disposed. The second insulating layer 105 may include at least one inorganic insulating material selected from the group consisting of $SiO_2$, $SiN_x$, SiON, $Al_2O_3$, $TiO_2$, $Ta_2O_5$, $HfO_2$, or $ZnO_2$. The second insulating layer 105 may be a monolayer or multi-layers including the aforementioned inorganic insulating material(s).

On the first insulating layer 103 of the display area DA, the storage capacitors Cst may be disposed. The storage capacitor Cst may include a lower electrode 144 and an upper electrode 146 overlapping the lower electrode 144. The lower electrode 144 of the storage capacitor Cst may overlap the gate electrode 136 of the thin film transistor TFT and may be integrally arranged or disposed. In an embodiment, the storage capacitor Cst may not overlap the thin film transistor TFT, and the lower electrode 144 may be a component separate from the gate electrode 136 of the thin film transistor TFT.

The upper electrode 146 of the storage capacitor Cst may include Al, Pt, Pd, Ag, Mg, Au, Ni, Nd, Ir, Cr, Li, Ca, Mo, Ti, W, and/or Cu, and may be a monolayer or multilayers including the above-listed material(s).

On the upper electrode 146 of the display area DA, a third insulating layer 107 may be disposed. The third insulating layer 107 may include at least one inorganic insulating material selected from the group consisting of $SiO_2$, $SiN_x$, SiON, $Al_2O_3$, $TiO_2$, $Ta_2O_5$, $HfO_2$, or $ZnO_2$. The third insulating layer 107 may be a monolayer or multi-layers including the aforementioned inorganic insulating material(s).

On the third insulating layer 107 of the display area DA, the data line DL, a lower driving voltage line PL1, a source electrode 137 that is the connection electrode, and a drain electrode 138 may be arranged or disposed.

The data line DL, the lower driving voltage line PL1, the source electrode 137, and the drain electrode 138 may each include a conductive material such as Mo, Al, Cu or Ti, and may include a monolayer or multilayers including the above material(s). The data line DL, the lower driving voltage line PL1, the source electrode 137, and the drain electrode 138 may have a multilayered structure of Ti/Al/Ti. In an embodiment, the data line DL, the lower driving voltage line PL1, the source electrode 137, and the drain electrode 138 may include the same or similar material.

On the data line DL, the lower driving voltage line PL1, the source electrode 137, and the drain electrode 138 of the display area DA, a first planarization layer 111 may be disposed. The first planarization layer 111 may be a monolayer or multilayers including an organic material or an inorganic material. The first planarization layer 111 may include a general-purpose polymer such as benzocyclobutene (BCB), polyimide, hexamethyldisiloxane (HMDSO), polymethylmethacrylate (PMMA) or polystylene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and a blend thereof. The first planarization layer 111 may include $SiO_2$, $SiN_x$, SiON, $Al_2O_3$, $TiO_2$, $Ta_2O_5$, $HfO_2$, or $ZnO_2$.

On the first planarization layer 111 of the display area DA, an upper driving voltage line PL2 and a contact metal layer CM may be disposed. The upper driving voltage line PL2 and the contact metal layer CM may include Al, Cu, Ti, or the like and may each be a monolayer or multilayers. The upper driving voltage line PL2 and the contact metal layer CM may have a multilayered structure of Ti/Al/Ti. In an embodiment, the upper driving voltage line PL2 and the contact metal layer CM may include the same or similar material.

The upper driving voltage line PL2 may be electrically connected to the contact hole penetrating the first planarization layer 111 and may prevent the driving voltage ELVDD from dropping, the driving voltage ELVDD provided through the driving voltage line PL.

The contact metal layer CM may be electrically connected to the thin film transistor TFT through the contact hole penetrating the first planarization layer 111, and the pixel electrode 210 may be electrically connected to the contact metal layer CM through the contact hole penetrating the second planarization layer 113.

On the upper driving voltage line PL2 and the contact metal layer CM of the display area DA, the second planarization layer 113 may be disposed. The second planarization layer 113 may be a monolayer or multilayers including an organic material or an inorganic material. The second planarization layer 113 may include general-purpose polymer such as BCB, polyimide, HMDSO, PMMA or PS, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and a blend thereof. The second planarization layer 113 may include $SiO_2$, $SiN_x$, SiON, $Al_2O_3$, $TiO_2$, $Ta_2O_5$, $HfO_2$, or $ZnO_2$.

On the second planarization layer 113, the organic light-emitting diode OLED including the pixel electrode 210, an intermediate layer 220, and the opposite electrode 230 may be disposed. The pixel electrode 210 may be electrically connected to the contact metal layer CM through the contact hole penetrating the second planarization layer 113, the contact metal layer CM may be electrically connected to the thin film transistor TFT through the contact hole penetrating the first planarization layer 111, and thus the organic light-emitting diode OLED may be electrically connected to the thin film transistor TFT.

On the second planarization layer 113, the pixel electrode 210 may be disposed. The pixel electrode 210 may be a transparent (translucent) electrode or a reflective electrode. The pixel electrode 210 may include a reflection layer including Al, Pt, Pd, Ag, Mg, Au, Ni, Nd, Ir, Cr, Li, Ca, Mo, Ti, W, Cu, and a combination thereof, and a transparent or translucent electrode layer formed or disposed on the reflection layer. The transparent or translucent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The pixel electrode 210 may have a stack structure of ITO/Ag/ITO.

A pixel-defining layer 180 may be disposed on the second planarization layer 113 and may include openings through which at least some or a predetermined number of portions or regions of the pixel electrode 210 may be exposed. The portions or regions exposed through the openings of the pixel-defining layer 180 may be defined as emission areas EA. Areas around the emission area EA may be non-emission areas NEA, and the non-emission areas NEA may surround the emission areas EA. For example, the display area DA may include the emission areas EA and the non-emission areas NEA surrounding the emission areas EA. The pixel-defining layer 180 may increase a distance between an upper portion of the pixel electrode 210 and the opposite electrode 230 and thus may prevent arcs from being generated at edges of the pixel electrode 210. The pixel-defining layer 180 may include, for example, an organic insulating material such as polyimide, polyamide, acryl resin, BCB, HMDSO, or phenol resin and may be formed by using a spin coating method, or other methods within the spirit and the scope of the disclosure.

The intermediate layer 220 may be disposed on the pixel electrode 210 of which at least a portion or region may be exposed by the pixel-defining layer 180. The intermediate layer 220 may include an emission layer 220b, and on and under or below the emission layer 220b, a first functional layer 220a and a second functional layer 220c may be selectively disposed.

The first functional layer 220a may include a hole injection layer (HIL) and/or a hole transport layer (HTL), and the second functional layer 220c may include an electron transport layer (ETL) and/or an electron injection layer (EIL).

The emission layer 220b may include an organic material including a fluorescent material or a phosphorescent material emitting red light, green light, blue light, or white light. The emission layer 220b may include a low-molecular organic material or a high-molecular organic material.

In a case that the emission layer 220b may include a low-molecular organic material, the intermediate layer 220 may have a single-layer structure or a stack structure in which an HIL, an HTL, an emission layer, and an EIL, and an ETL may be stacked, and may include various organic materials such as copper phthalocyanine (CuPc), N,N'-Di(napthalene-1-yl)-N,N'-diphenyl-benzidine (NPB), and tris-8-hydroxyquinoline aluminum ($Alq_3$) as a low-molecular organic material. Such layers may be formed by using a vacuum deposition method.

In a case that the emission layer 220b may include a high-molecular material, the intermediate layer 220 may mostly have a structure including the HTL and the emission layer. In this case, the HTL may include PEDOT, and the emission layer may include a high-molecular material such as poly-phenylene vinylene (PPV)-based material and polyfluorene-based material. The emission layer may be formed by using a screen printing method, an inkjet printing method, a laser induced thermal imaging (LITI) method, or the like within the spirit and the scope of the disclosure.

The first and second functional layers 220a and 220c, which may be disposed on and under or below the emission layer 220b, may be integrally formed over the entire display panel by using an open mask. The functional layers disposed in the first area 1A may be removed by laser. Due to the removal of the functional layers in the first area 1A, the transmittance of the first area 1A may increase.

On the intermediate layer 220, the opposite electrode 230 may be disposed. The opposite electrode 230 may be disposed on the intermediate layer 220 and may cover or overlap the same. The opposite electrode 230 may be above the display area DA and may cover or overlap the entire display area DA. For example, the opposite electrode 230 may be integrally formed or disposed on the entire display panel to cover or overlap the pixels P in the display area DA by using the open mask.

Referring to FIG. 10, the opposite electrode 230 may include a first hole 230H corresponding to the first area 1A. For example, as the opposite electrode 230 in the first area 1A is removed by laser, the first hole 230H may be formed. Due to the first hole 230H of the opposite electrode 230 that corresponds to the first area 1A, the transmittance of the first area 1A may be improved.

Referring back to FIG. 9, the opposite electrode 230 may include a conductive material having a low work function. For example, the opposite electrode 230 may include a (translucent) transparent layer including Ag, Mg, Al, Pt, Pd, Au, Ni, Nd, Ir, Cr, Li, Ca, or an alloy thereof. Alternatively, the opposite electrode 230 may include a layer including ITO, IZO, ZnO, or $In_2O_3$ on the (translucent) transparent layer including the aforementioned materials.

The organic light-emitting diode OLED may be covered or overlapped by the thin film encapsulation layer 300a. The thin film encapsulation layer 300a may include at least one inorganic encapsulation layer and at least one organic encapsulation layer. In an embodiment, the thin film encapsulation layer 300a may include a first inorganic encapsulation layer 310 and a second inorganic encapsulation layer 330 with an organic encapsulation layer 320 therebetween.

The first inorganic encapsulation layer 310 and the second inorganic encapsulation layer 330 may each include at least one inorganic insulating material. The inorganic insulating material may include $Al_2O_3$, $TiO_2$, $Ta_2O_5$, $HfO_2$, $ZnO_2$, $SiO_2$, $SiN_x$, and/or SiON. The organic encapsulation layer 320 may include a polymer-based material. The polymer-based material may include acryl-based resin, epoxy-based resin, polyimide, polyethylene, and the like within the spirit and the scope of the disclosure. For example, the organic encapsulation layer 320 may include acryl-based resin, for example, methyl methacrylate, polyacrylic acid, and the like within the spirit and the scope of the disclosure.

On the substrate 100 of the first area 1A, the buffer layer 101 may be disposed. The buffer layer 101 of the first area 1A may be a region where at least some or a predetermined number of portions or regions of the buffer layer 101 in the display area DA may be continuously disposed in the first area 1A. For example, the buffer layer 101 disposed in the display area DA may be continuously disposed in the first area 1A.

On the buffer layer 101 of the first area 1A, the first insulating layer 103 may be disposed. The first insulating layer 103 of the first area 1A may be a region where at least some or a predetermined number of portions of the first insulating layer 103 in the display area DA may be continuously disposed in the first area 1A. For example, the first insulating layer 103 disposed in the display area DA may be continuously disposed in the first area 1A.

On the first insulating layer 103 of the first area 1A, the data connection line 130 may be disposed. The data connection line 130 may be disposed in the first area 1A, may extend in the second direction (the y direction), and may electrically connect the data lines DL that may be disconnected in the first area 1A therebetween. The data connection line 130 may be disposed at the same layer as the gate electrode 136 and may include the same or similar material as the gate electrode 136.

On the data connection line 130 of the first area 1A, the second insulating layer 105 may be disposed. The second insulating layer 105 of the first area 1A may be a region where at least some or a predetermined number of portions of the second insulating layer 105 in the display area DA may be continuously disposed in the first area 1A. For example, the second insulating layer 105 in the display area DA may be continuously disposed in the first area 1A.

On the second insulating layer 105 of the first area 1A, the third insulating layer 107 may be disposed. The third insulating layer 107 of the first area 1A may be a region where at least some or a predetermined number of portions of the third insulating layer 107 in the display area DA may be continuously disposed in the first area 1A. For example, the third insulating layer 107 disposed in the display area DA may be continuously disposed in the first area 1A.

On the third insulating layer 107 disposed in the first area 1A, the thin film encapsulation layer 300a may be disposed. The thin film encapsulation layer 300a may include at least one inorganic encapsulation layer and at least one organic encapsulation layer. In an embodiment, the thin film encapsulation layer 300a may include the first inorganic encapsulation layer 310, the second inorganic encapsulation layer 330, and the organic encapsulation layer 320 therebetween.

The first inorganic encapsulation layer 310 and the second inorganic encapsulation layer 330 may each include at least one inorganic insulating material. The inorganic insulating material may include $Al_2O_3$, $TiO_2$, $Ta_2O_5$, $HfO_2$, $ZnO_2$, $SiO_2$, $SiN_x$, and/or SiON. The organic encapsulation layer 320 may include a polymer-based material. The polymer-based material may include acryl-based resin, epoxy-based resin, polyimide, polyethylene, and the like within the spirit and the scope of the disclosure. For example, the organic encapsulation layer 320 may include acryl-based resin, for example, methyl methacrylate, polyacrylic acid, and the like within the spirit and the scope of the disclosure.

In the first area 1A, the first planarization layer 111 and the second planarization layer 113, which may be disposed in the display area DA, may not be disposed. As the first planarization layer 111 and the second planarization layer 113 may be not disposed in the first area 1A, the transmittance of the first area 1A may be improved.

Referring to FIG. 11, the data line DL and the data connection line 130 may be electrically connected to each other through the contact hole CNT penetrating the second insulating layer 105 and the third insulating layer 107. As the data connection line 130 may electrically connect the data lines DL, which may be disconnected in the first area 1A therebetween, through the contact hole CNT penetrating the second insulating layer 105 and the third insulating layer 107, the data signals may be transmitted to the pixels P in the upper side of the first area 1A.

Figure 12:
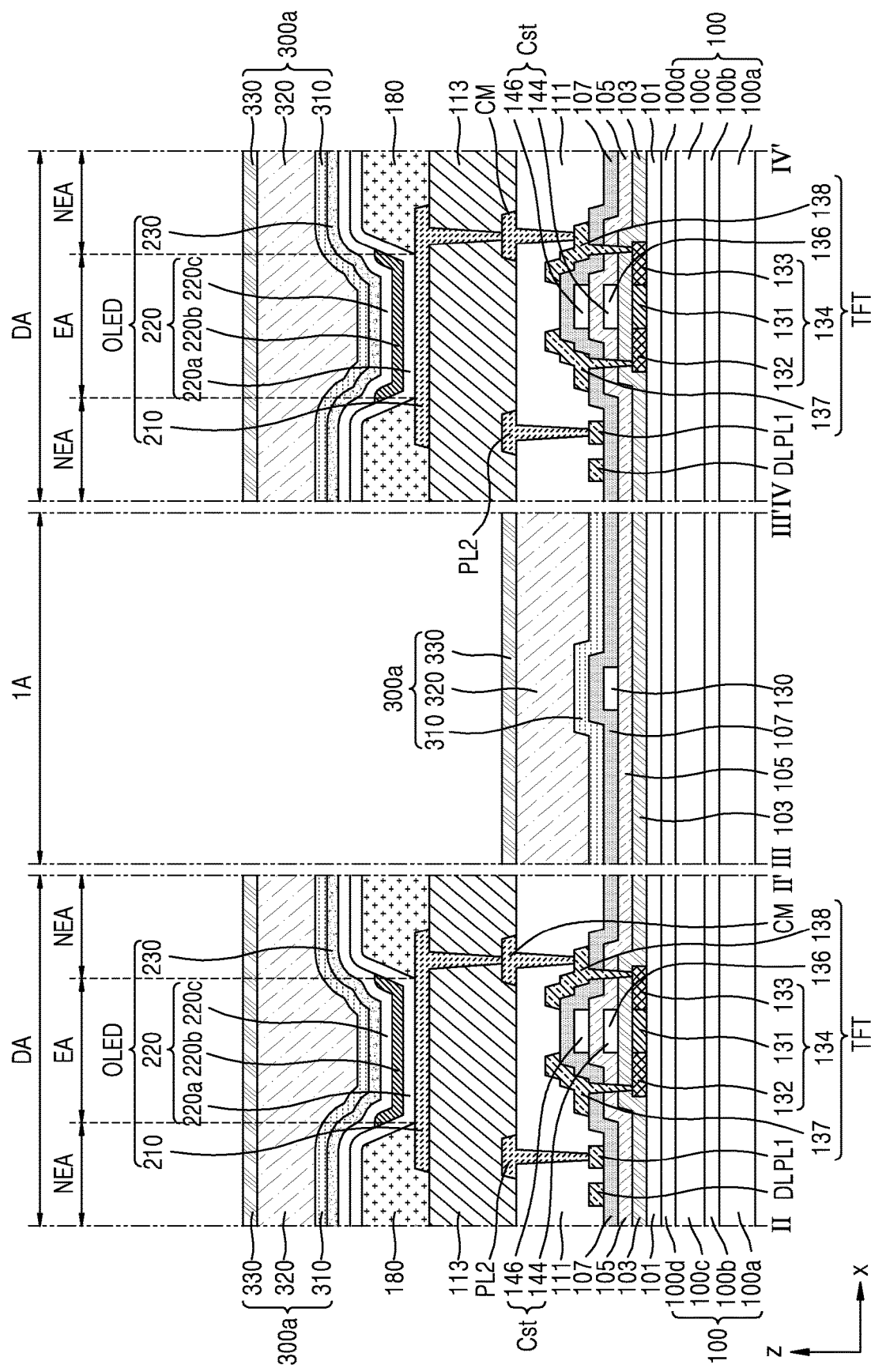
FIGS. 12 and 13 are schematic cross-sectional views of a portion of a display apparatus according to an embodiment.
Figure 13:
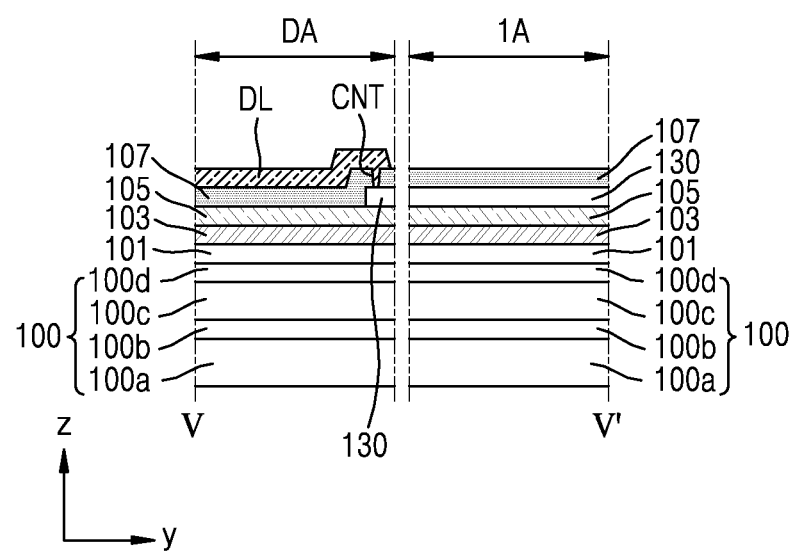

FIGS. 12 and 13 are schematic cross-sectional views of a portion of the display apparatus according to an embodiment. In more detail, FIG. 12 is a schematic cross-sectional view of the display apparatus, taken along lines II-II', III-III', and IV'-IV' of FIG. 7, and FIG. 13 is a schematic cross-sectional view of the display apparatus, taken along a line V-V' of FIG. 7.

The embodiment of FIG. 12 may differ from that of FIG. 9 in that the data connection line 130 may be disposed on the second insulating layer 105. Structures of FIG. 12, which may be identical to those of FIG. 9, will not be described again, and a difference therebetween will be mainly described hereinafter.

Referring to FIG. 12, the buffer layer 101 may be disposed on the substrate 100 of the first area 1A, the first insulating layer 103 may be disposed on the buffer layer 101, and the second insulating layer 105 may be disposed on the first insulating layer 103. The buffer layer 101, the first insulating layer 103, and the second insulating layer 105 of the first area 1A may be regions where the buffer layer 101, the first insulating layer 103, and the second insulating layer 105 of the display area DA may be continuously disposed.

On the second insulating layer 150 of the first area 1A, the data connection line 130 may be disposed. The data connection line 130 may be disposed in the first area 1A, extend in the second direction (the y direction), and electrically connect the data lines DL that may be disconnected in the first area 1A therebetween. The data connection line 130 may be at the same layer as the upper electrode 146 of the storage capacitor Cst and may include the same or similar material as the upper electrode 146 of the storage capacitor Cst.

The third insulating layer 107 may be disposed on the data connection line 130 of the first area 1A, and the thin film encapsulation layer 300a may be disposed on the third insulating layer 107.

Referring to FIG. 13, the data lines DL and the data connection line 130 may be electrically connected through the contact hole CNT penetrating the third insulating layer 107. As the data connection line 130 electrically connects the data lines DL, which may be disconnected in the first area 1A therebetween, through the contact hole CNT penetrating the third insulating layer 107, the data signals may be transmitted to the pixels P arranged or disposed on the upper side of the first area 1A.

Figure 14:
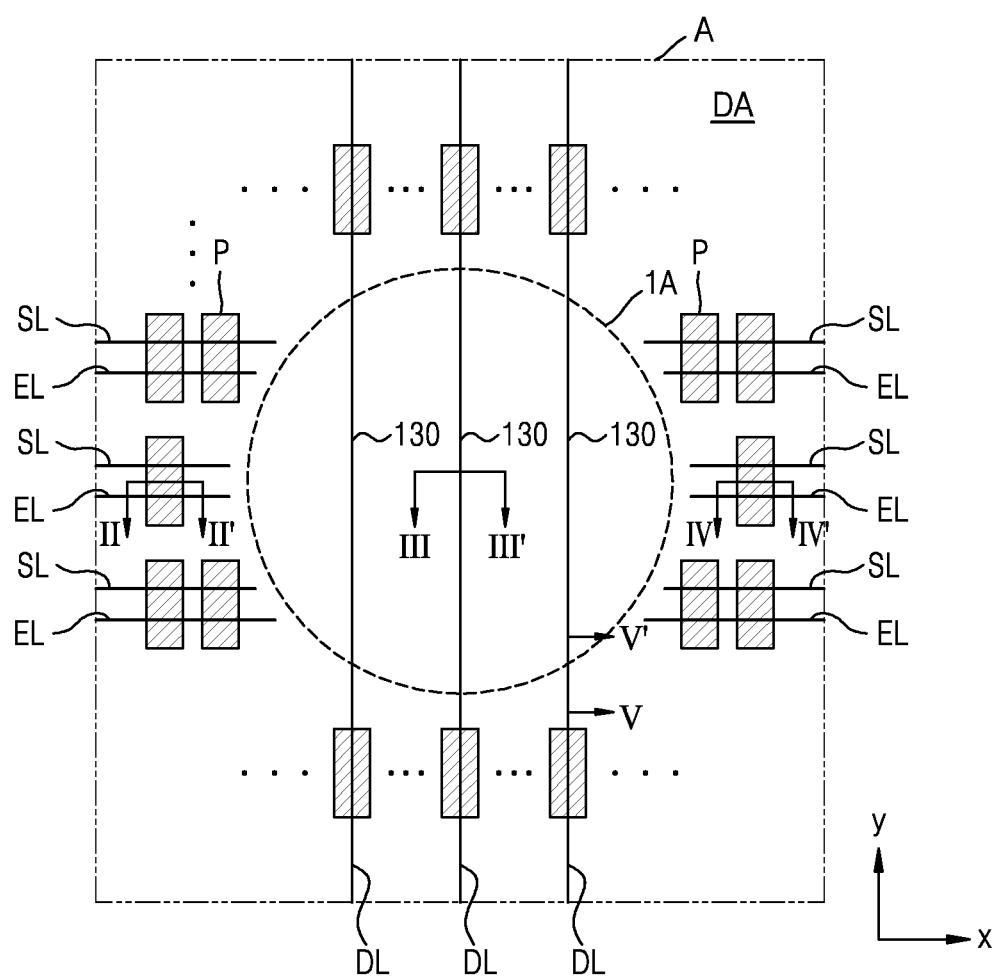
FIG. 14 is a plan view of a portion of a display apparatus according to an embodiment.
Figure 15:
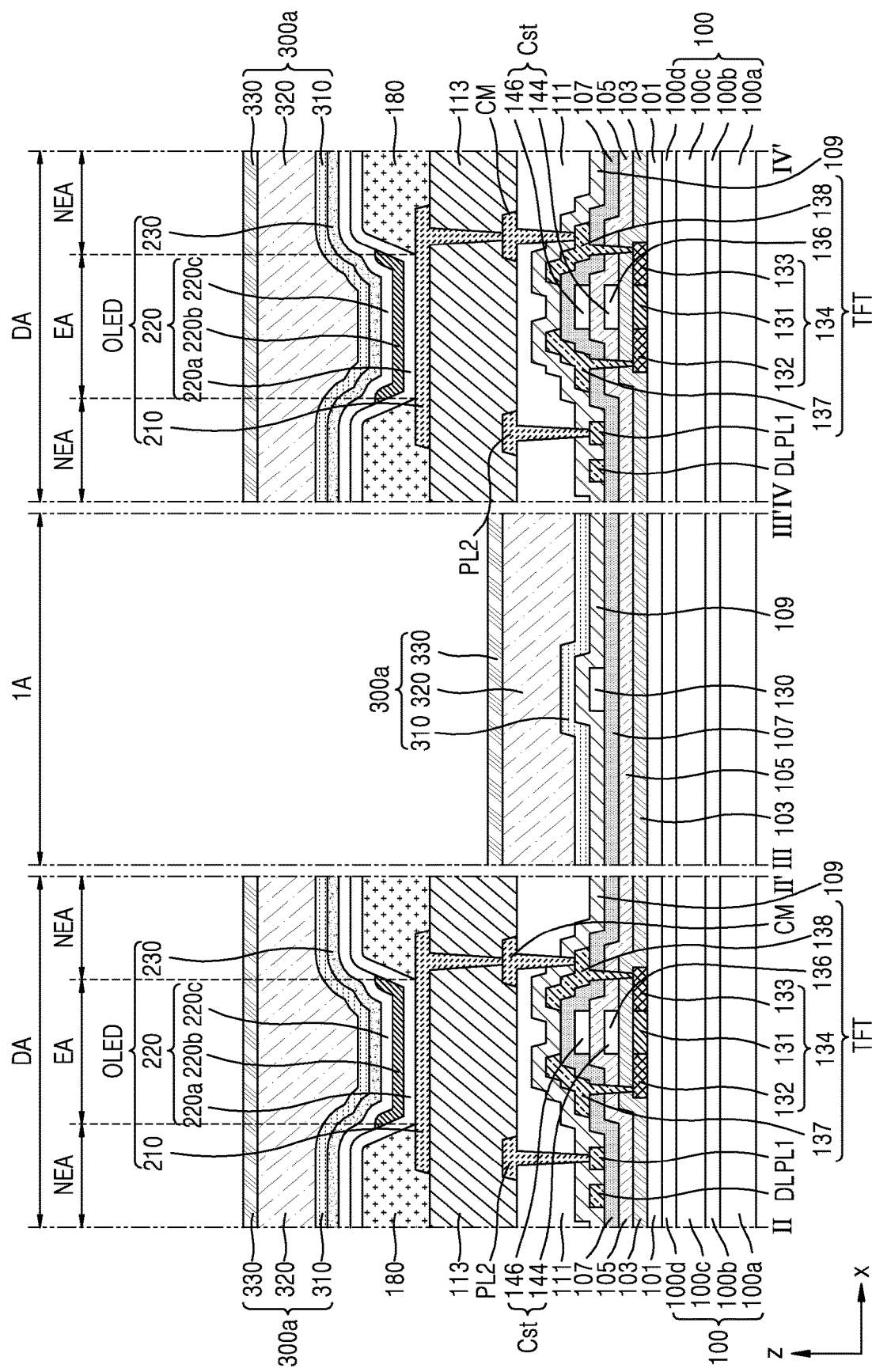
FIGS. 15 and 16 are schematic cross-sectional views of a portion of a display apparatus according to an embodiment.
Figure 16:
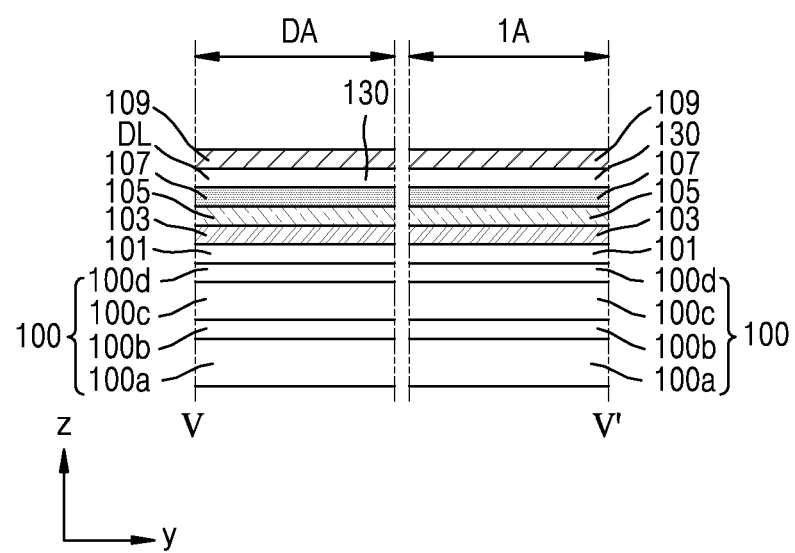

FIG. 14 is a plan view of a portion or region of the display apparatus according to an embodiment, and FIGS. 15 and 16 are schematic cross-sectional views of a portion or region of the display apparatus according to an embodiment. In more detail, FIG. 14 is an plan view showing an enlarged portion or region A of the display apparatus of FIG. 4, FIG. 15 is a schematic cross-sectional view of the display apparatus taken along lines and II-II', III-III', and IV'-IV' of FIG. 14, and FIG. 16 is a schematic cross-sectional view of the display apparatus taken along a line V-V' of FIG. 14.

The embodiments of FIGS. 14 to 16 may differ from those of FIGS. 7, 9 and 11 in that the data lines DL and the data connection lines 130 may be disposed at the same layer. Structures of FIGS. 14 to 16, which may be identical to those of FIGS. 7, 9 and 11, will not be described again, and a difference therebetween will be mainly described hereinafter.

Referring to FIG. 14, the scan lines SL and the emission control lines EL may be disposed in the display area DA. The scan lines SL may respectively provide the scan signals to the pixels P, may extend in the first direction (the x direction), and may be disconnected in the first area 1A therebetween. The emission control lines EL may respectively provide the emission control signals to the pixels P, extend in the first direction (the x direction), and may be disconnected in the first area 1A therebetween.

In the display area DA, the data lines DL may be arranged or disposed. The data lines DL may extend in the second direction (the y direction) crossing or intersecting the first direction (the x direction) and may provide the data signals to the pixels P, respectively. In the first area 1A, the data connection lines 130 may be disposed. The data connection lines 130 may extend in the second direction (the y direction) and may be electrically connected to the data lines DL. The data connection lines 130 and the data lines DL may be at the same layer and may include the same or similar material. The data connection lines 130 and the data lines DL may be electrically connected to each other at the same layer. For example, the data connection lines 130 and the data lines DL may be integrally formed.

Referring to FIG. 15, a protection layer 109 may be disposed on the data lines DL, the lower driving voltage line PL1, the source electrode 137, and the drain electrode 138 of the display area DA. The protection layer 109 may include at least one inorganic insulating layer selected from the group consisting of $SiO_2$, $SiN_x$, SiON, $Al_2O_3$, $TiO_2$, $Ta_2O_5$, $HfO_2$, or $ZnO_2$. The protection layer 109 may be a monolayer or multilayers including the aforementioned inorganic insulating material(s).

The buffer layer 101 may be disposed on the substrate 100 of the first area 1A, the first insulating layer 103 may be disposed on the buffer layer 101, the second insulating layer 105 may be disposed on the first insulating layer 103, and the third insulating layer 107 may be disposed on the second insulating layer 105. The buffer layer 101, the first insulating layer 103, the second insulating layer 105, and the third insulating layer 107 of the first area 1A may be regions where the buffer layer 101, the first insulating layer 103, the second insulating layer 105, and the third insulating layer 107 may be continuously disposed in the display area DA.

The data connection line 130 may be disposed on the third insulating layer 107 of the first area 1A. The data connection line 130 may be disposed in the first area 1A, extend in the second direction (the y direction), and electrically connect the data lines DL that may be disconnected in the first area 1A therebetween. The data connection line 130 may be at the same layer and include the same or similar material as the data lines DL. In an embodiment, the data connection line 130 and the data lines DL may be integrally formed.

The protection layer 109 may be disposed on the data connection line 130 of the first area 1A, and the thin film encapsulation layer 300a may be disposed on the protection layer 109. The protection layer 109 of the first area 1A may be a region where the protection layer 109 disposed in the display area DA may be continuously disposed.

Referring to FIG. 16, the data line DL may be disposed on the third insulating layer 107 of the display area DA, and the data connection line 130 may be disposed on the third insulating layer 107 of the first area 1A. The data line DL and the data connection line 130 may be electrically connected. As the data connection line 130 electrically connects the data lines DL, which may be disconnected in the first area 1A therebetween, the data signals may be transmitted to the pixels P arranged or disposed on the upper side of the first area 1A. In an embodiment, the data line DL and the data connection line 130 may be integrally formed at the same layer.

The protection layer 109 may be disposed on the data line DL in the display area DA and the data connection line 130 in the first area 1A. The protection layer 109 in the first area 1A may be a region where at least some or a predetermined number of portions of the protection layer 109 may be continuously disposed in the display area DA.

Figure 17:
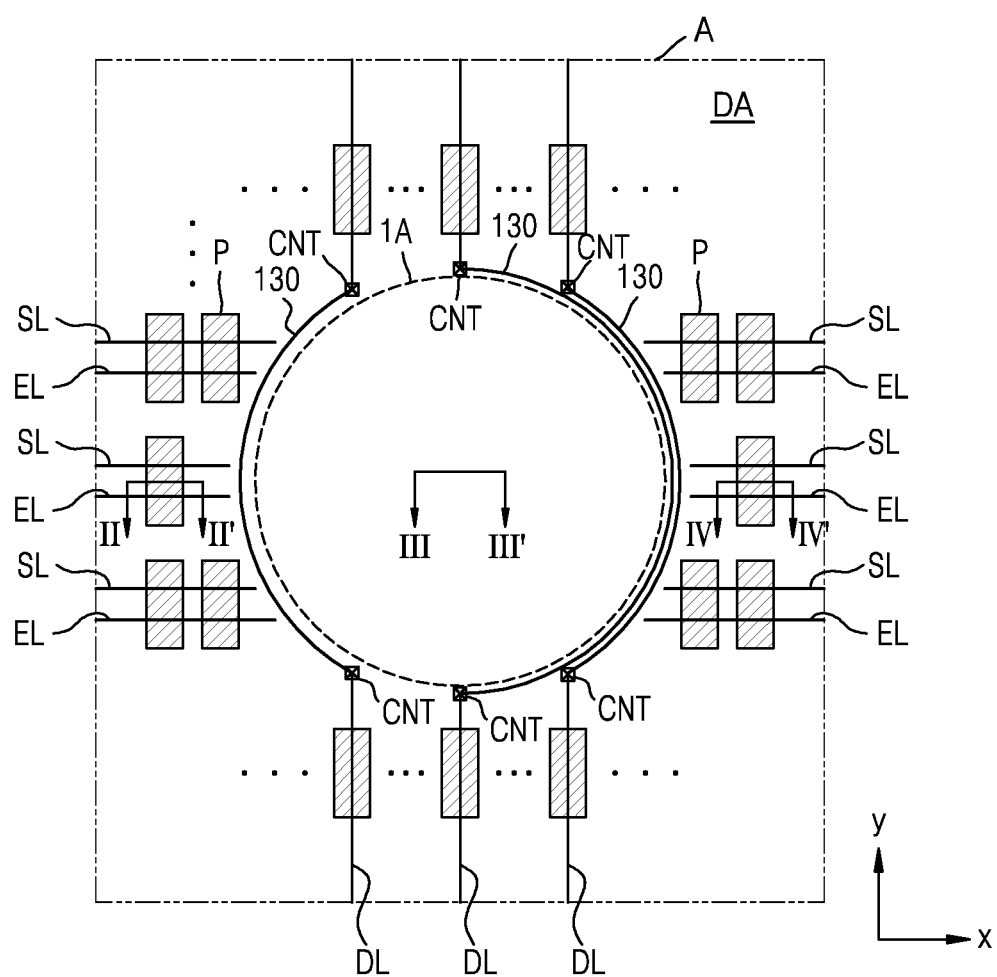
FIGS. 17 and 18 are plan views of a portion of a display apparatus according to an embodiment.
Figure 18:
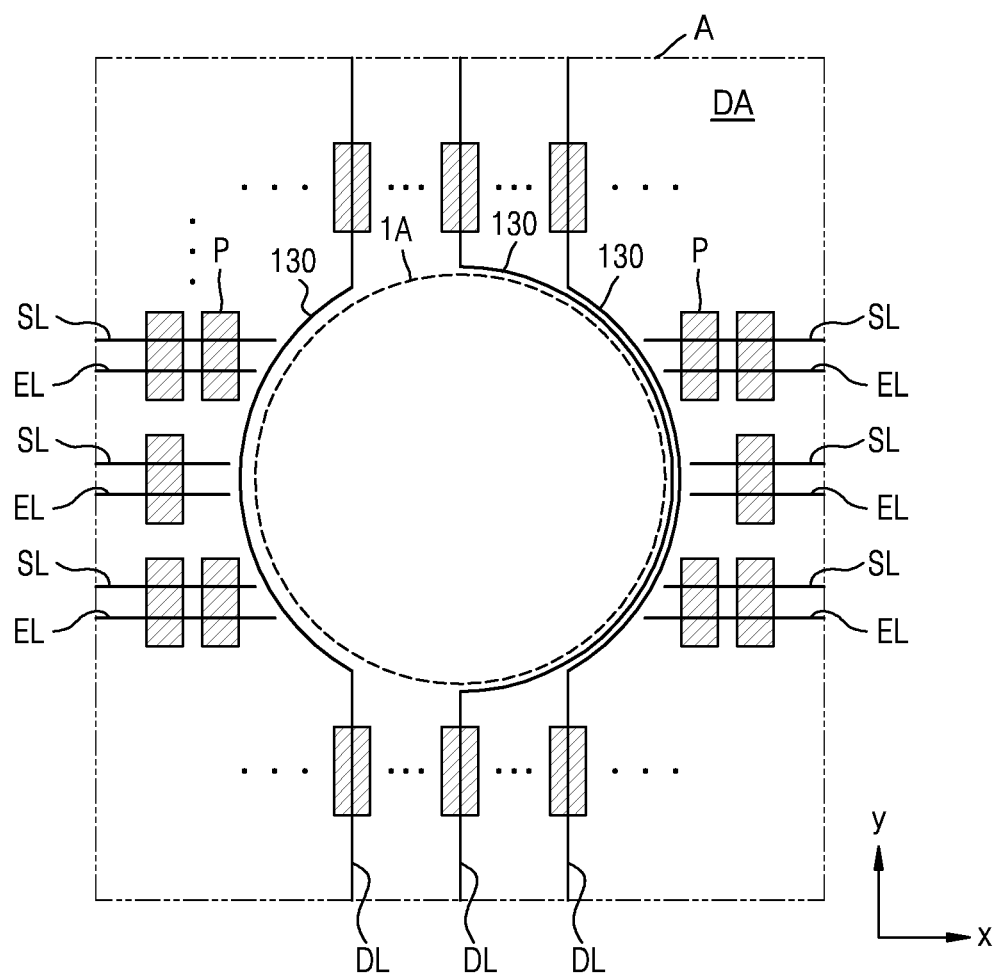
Figure 19:
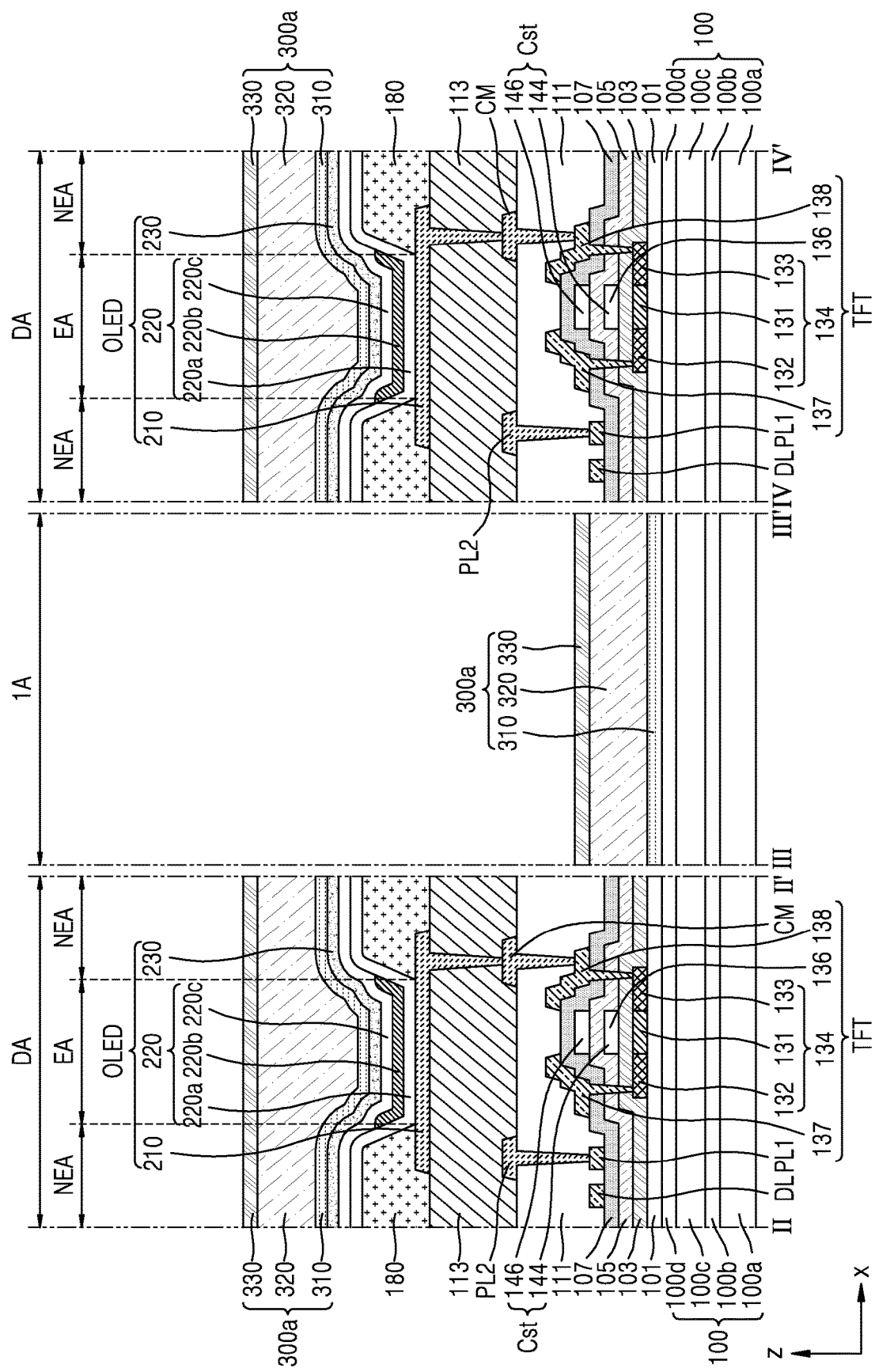
FIG. 19 is a schematic cross-sectional view of a portion of a display apparatus according to an embodiment.

FIGS. 17 and 18 are plan views of a portion of the display apparatus according to an embodiment, and FIG. 19 is a schematic cross-sectional view of a portion of the display apparatus according to an embodiment. In more detail, FIGS. 17 and 18 are plan views showing the enlarged portion or region A of the display apparatus of FIG. 4, and FIG. 19 is a schematic cross-sectional view of the display apparatus taken along lines II-II', III-III', and IV'-IV' of FIG. 17.

The embodiments of FIGS. 17 and 18 may differ from those of FIGS. 7 and 14 in that the data connection line 130 may bypass an outer periphery of the first area 1A, and the embodiment of FIG. 19 may differ from that of FIG. 9 in that the thin film encapsulation layer 300a may be directly disposed on the substrate 100 of the first area 1A. Structures of FIGS. 17 to 19, which may be identical to those of FIGS. 7, 9 and 14, will not be described again, and a difference therebetween will be mainly described hereinafter.

Referring to FIG. 17, the data lines DL may be arranged or disposed in the display area DA. The data lines DL may respectively provide the data signals to the pixels P, may extend in the second direction (the y direction) crossing or intersecting the first direction (the x direction), and may be disconnected in the first area 1A therebetween. The data lines DL, which may be disconnected in the first area 1A therebetween, may bypass the periphery of the first area 1A and may be electrically connected by the data connection lines 130 extending in the second direction (the y direction).

The data lines DL and the data connection lines 130 may be electrically connected through the contact hole CNT, and the contact hole CNT electrically connecting the data lines DL and the data connection lines 130 may be disposed in the display area DA.

As the data connection lines 130 may be electrically connected to the data lines DL, which may be disconnected in the first area 1A therebetween, through the contact hole CNT, the data signals may be transmitted to the pixels P arranged or disposed on the upper side of the first area 1A.

In an embodiment, the data connection lines 130 may be at the same layer and may include the same or similar material as the gate electrode 136 (see FIG. 19) of the thin film transistor TFT, may be at the same layer and may include the same or similar material as the upper electrode 146 (see FIG. 19) of the storage capacitor Cst, and may be at the same layer and may include the same or similar material as the upper driving voltage line PL2 (see FIG. 19). For example, the data connection lines 130 may be at the same layer and may include the same or similar material as the data lines DL.

Referring to FIG. 18, the data lines DL may be arranged or disposed in the display area DA. The data lines DL may extend in the second direction (the y direction) crossing or intersecting the first direction (the x direction) and may respectively provide the data signals to the pixels P. The data connection lines 130 may be disposed in the display area DA. The data connection lines 130 may be arranged or disposed between the first area 1A and the pixels P. The data connection lines 130 may bypass the edges of the first area 1A and may extend in the second direction (the y direction). The data connection lines 130 bypassing the periphery of the first area 1A may be electrically connected to the data lines DL. The data connection lines 130 may be at the same layer and may include the same or similar material as the data lines DL. The data connection lines 130 and the data lines DL may be at the same layer and may be electrically connected to each other. For example, the data connection lines 130 and the data lines DL may be integrally formed.

Referring to FIG. 19, the substrate 100 of the first area 1A may include the first substrate 100a, the first barrier layer 100b disposed on the first substrate 100a, the second substrate 100c disposed on the first barrier layer 100b, and the second barrier layer 100d disposed on the second substrate 100c, and the thin film encapsulation layer 300a may be disposed on the substrate 100 of the first area 1A. In more detail, while the contact hole is formed in the display area DA, the buffer layer 101, the first insulating layer 103, the second insulating layer 105, and the third insulating layer 107, which may be disposed on the substrate 100 of the first area 1A, may be simultaneously removed, and thus the thin film encapsulation layer 300a may be directly disposed on the substrate 100 of the first area 1A. In an embodiment, while the contact hole is formed in the display area DA, the second substrate 100c and the second barrier layer 100d may also be removed.

Insulating layers disposed in the first area 1A may be removed during the process in which the contact hole is formed in the display area DA to directly dispose the thin film encapsulation layer 300a on the substrate 100, and thus, the transmittance of the first area 1A may be improved.

Figure 20:
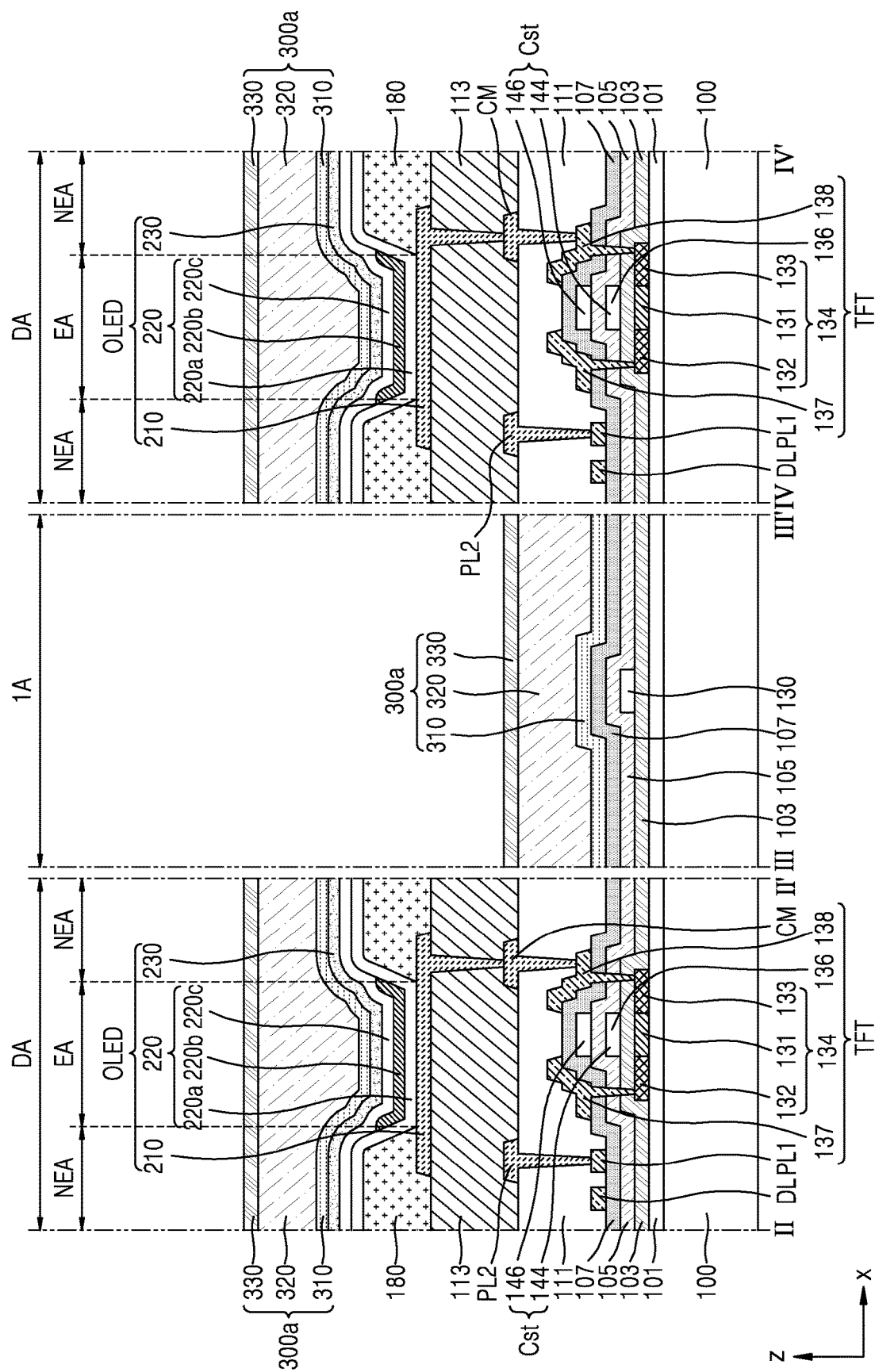
FIG. 20 is a schematic cross-sectional view of a portion of a display apparatus according to an embodiment.

FIG. 20 is a schematic cross-sectional view of a portion or region of the display apparatus according to an embodiment.

The embodiment of FIG. 20 may differ from that of FIG. 9 in that the substrate 100 may include glass instead of including the first substrate 100a including polymer resin and the second substrate 100c. Structures of FIG. 20, which may be identical to those of FIG. 9, will not be described again, and a difference therebetween will be mainly described hereinafter.

Referring to FIG. 20, the substrate 100 may include glass. For example, the substrate 100 may include glass of which a main component may be $SiO_2$. As the substrate 100 of the display panel may include the glass, the penetration of impurities, moisture, or external air from the bottom of the substrate 100 may decrease or may be prevented.

Figure 21:
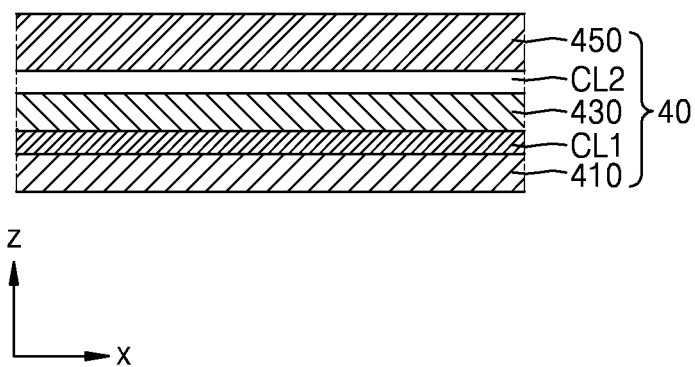
FIG. 21 is a schematic cross-sectional view of an input sensing section of a display apparatus according to an embodiment.

FIG. 21 is a schematic cross-sectional view of the input sensing section of the display apparatus, according to an embodiment.

Referring to FIG. 21, the input sensing section 40 according to an embodiment may include a first touch insulating layer 410, a first conductive layer CL1, a second touch insulating layer 430, a second conductive layer CL2, and a third touch insulating layer 450. The first conductive layer CL1 and the second conductive layer CL2 may each have a single-layer structure or a multilayered structure. A conductive layer of the single-layer structure may include a metal layer or a transparent conductive layer. The metal layer may include Mo, Ag, Ti, Cu, Al, and an alloy thereof. The transparent conductive layer may include transparent conductive oxide such as ITO, IZO, ZnO, or ITZO. The transparent conductive layer may include a conductive polymer such as PEDOT, metal nano wires, and graphene.

The conductive layer having a multilayered structure may include metal layers. The metal layers may each have, for example, a tri-layered structure of Ti/Al/Ti. A conductive layer having a multi-layered structure may include at least one metal layer and at least one transparent conductive layer.

The first conductive layer CL1 and the second conductive layer CL2 may each include multiple patterns. Hereinafter, the first conductive layer CL1 may include first conductive patterns, and the second conductive layer CL2 may include second conductive patterns. The first conductive patterns and the second conductive patterns may include sensing electrodes and signal lines shown in FIG. 22.

Stack structures and materials of the sensing electrodes may be determined by considering the sensing sensitivity. An RC delay may affect the sensing sensitivity, and since the sensing electrodes including the metal layers may have smaller resistance than the transparent conductive layer, an RC value may decrease. Therefore, a charging time of a capacitor defined between the sensing electrodes may decrease. The sensing electrodes including the transparent conductive layers may not be viewed by a user in comparison with the metal layers, and a capacitance may increase according to an increase in an input area.

The sensing electrodes including the metal layers may have mesh shapes so as not to be viewed by the user, as described below.

The first touch insulating layer 410, the second touch insulating layer 430, and the third touch insulating layer 450 may each have a single-layer structure or a multilayered structure. The first touch insulating layer 410, the second touch insulating layer 430, and the third touch insulating layer 450 may each include an inorganic material, an organic material, or a composite material.

As an example embodiment, at least any one of the first touch insulating layer 410, the second touch insulating layer 430, and the third touch insulating layer 450 may include an inorganic layer. The inorganic layer may include at least one of $Al_2O_3$, $TiO_2$, $SiO_2$, SiON, $ZrO_2$, and $HfO_2$.

As an example embodiment, at least any one of the first touch insulating layer 410, the second touch insulating layer 430, and the third touch insulating layer 450 may include an organic layer. The organic layer may include at least any one of acryl-based resin, methacrylate-based resin, polyisoprene, vinyl-based resin, epoxy-based resin, polyurethane-based resin, cellulose-based resin, siloxane-based resin, polyimide-based resin, polyamide-based resin, and perylene-based resin.

Figure 22:
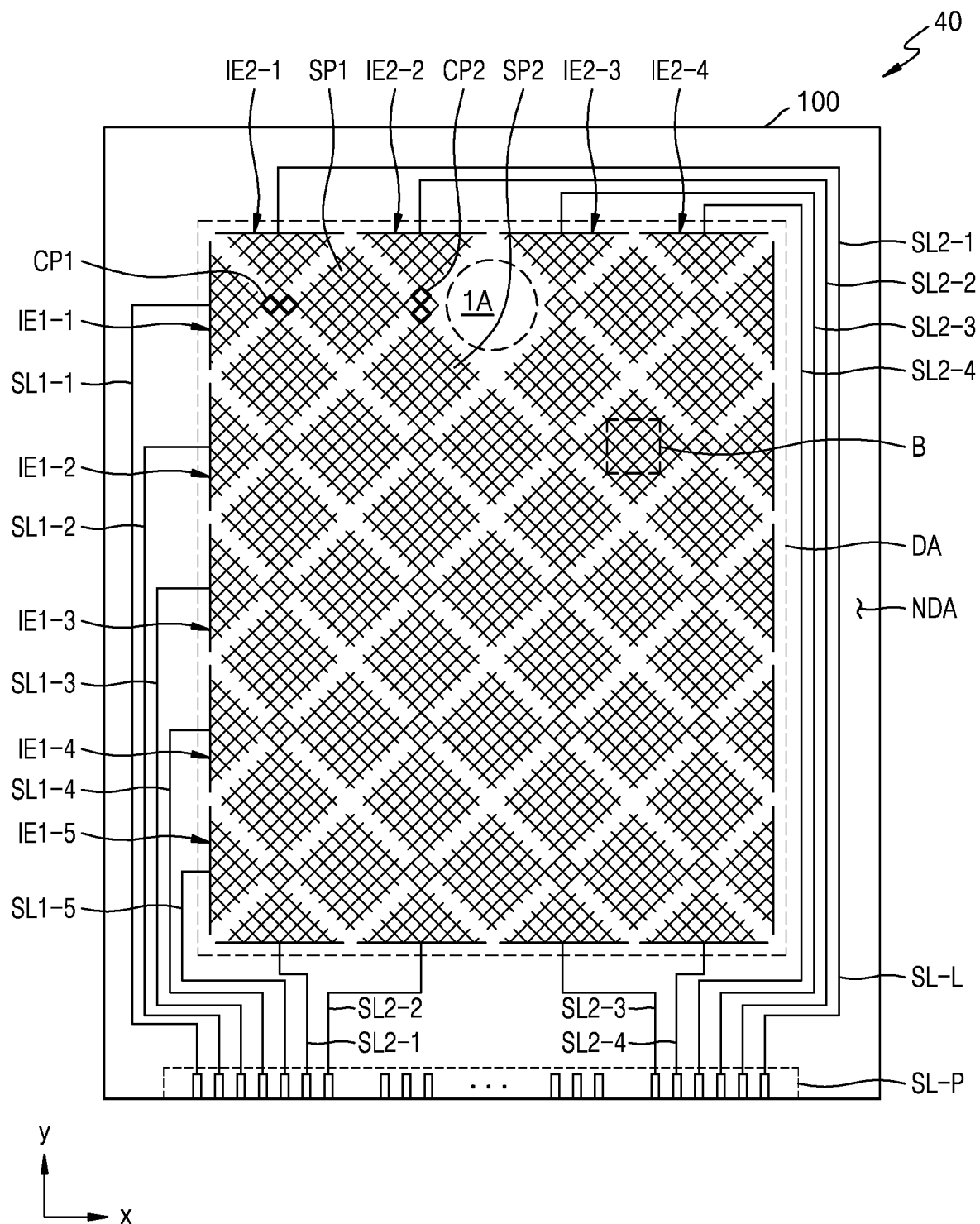
FIG. 22 is a plan view of an input sensing section of a display apparatus according to an embodiment.
Figure 23:
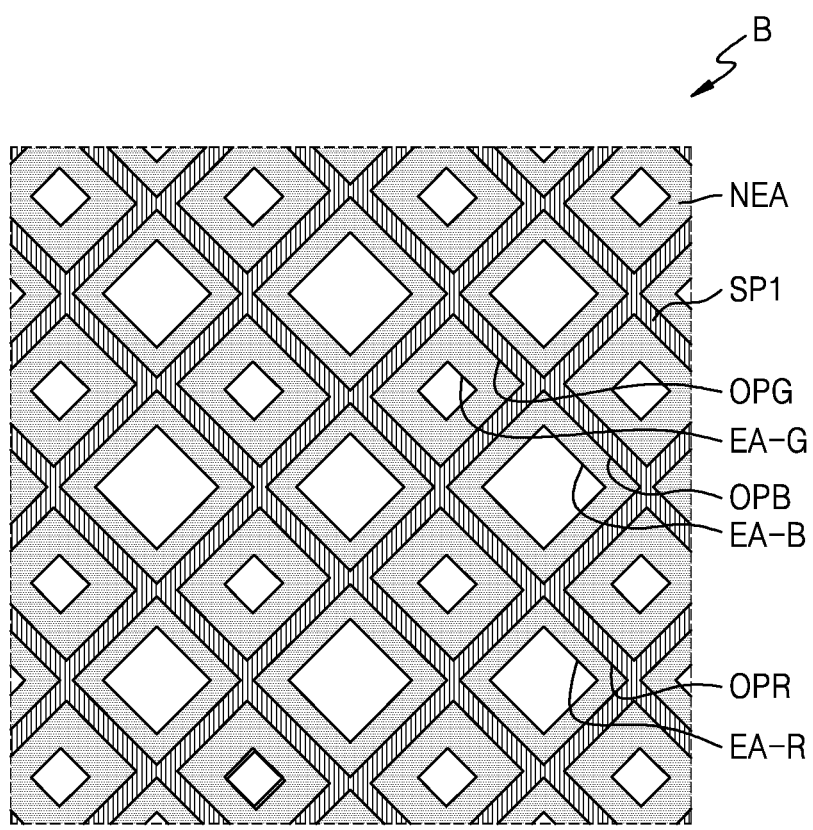
FIG. 23 is an enlarged view of a portion B of FIG. 22.

FIG. 22 is a schematic plan view of the input sensing section of the display apparatus according to an embodiment, and FIG. 23 is a schematic view of an enlarged portion or region B of the display apparatus of FIG. 22.

Referring to FIG. 22, the input sensing section 40 may include first sensing electrodes IE1-1 to IE1-5, first signal lines SL1-1 to SL1-5 electrically connected to the first sensing electrodes IE1-1 to IE1-5, second sensing electrodes IE2-1 to IE2-4, and second signal lines SL2-1 to SL2-4 electrically connected to the second sensing electrodes IE2-1 to IE2-4.

The input sensing section 40 according to an embodiment forms the first sensing electrodes IE1-1 to IE1-5 from the first conductive layer CL1 (see FIG. 21) and the second sensing electrodes IE2-1 to IE2-4 from the second conductive layer CL2 (see FIG. 21). FIG. 22 shows an example in which the first sensing electrodes IE1-1 to IE1-5 and the second sensing electrodes IE2-1 to IE2-4 have substantially mesh shapes. In an embodiment, the first sensing electrodes IE1-1 to IE1-5 and the second sensing electrodes IE2-1 to IE2-4 may each have a tri-layer structure of Ti/Al/Ti.

Although not shown, the input sensing section 40 may include optical dummy electrodes disposed on boundary regions between the first sensing electrodes IE1-1 to IE1-5 and the second sensing electrodes IE2-1 to IE2-4. With regard to this, the input sensing section 40 may include first dummy electrodes (not shown) formed from the first conductive layer CL1 and second dummy electrodes (not shown) formed from the second conductive layer CL2.

The first dummy electrodes may be electrically connected to second sensing portions SP2 of the second sensing electrodes IE2-1 to IE2-4 through the contact holes. The second dummy electrodes may be electrically connected to first sensing portions SP1 of the first sensing electrodes IE1-1 to IE1-5 through the contact holes. The first dummy electrodes and the second dummy electrodes may decrease resistances of the first sensing electrodes IE1-1 to IE1-5 and the second sensing electrodes IE2-1 to IE2-4.

Each of the first sensing electrodes IE1-1 to IE1-5 may include the first sensing portions SP1 and first connection portions CP1. Each of the second sensing electrodes IE2-1 to IE2-4 may include the second sensing portions SP2 and second connection portions CP2. Two of the first sensing portions SP1, which may be disposed on both ends of the first electrode, may have a smaller size, for example, a half, than the first sensing portion at the center. Two of the second sensing portions SP2, which may be disposed on both ends of the second electrode, may have a smaller size, for example, a half, than the second sensing portion at the center.

As shown in FIG. 22, the first sensing electrodes IE1-1 to IE1-5 and the second sensing electrodes IE2-1 to IE2-4 have patterns having predetermined shapes. However, shapes of the first sensing electrodes IE1-1 to IE1-5 and the second sensing electrodes IE2-1 to IE2-4 are not limited thereto. In an embodiment, FIG. 22 shows an example in which the first sensing portions SP1 and the second sensing portions SP2 may have substantially rhombus shapes, but one or more embodiments are not limited thereto. The first sensing portions SP1 and the second sensing portions SP2 may have other substantially polygonal shapes. In another embodiment, the first sensing electrodes IE1-1 to IE1-5 and the second sensing electrodes IE2-1 to IE2-4 may have shapes (for example, substantially bar shapes) that may not be distinguishable from the connection portions of the sensing portions.

The first sensing portions SP1 in a single first sensing electrode may be arranged or disposed in the first direction (the x direction), and the second sensing portions SP2 in a single second sensing electrode may be arranged or disposed in the second direction (the y direction). The first connection portions CP1 may respectively electrically connect adjacent first sensing portions SP1, and the second connection portions CP2 may respectively electrically connect adjacent second sensing portions SP2.

The first signal lines SL1-1 to SL1-5 may be respectively electrically connected to ends of the first sensing electrodes IE1-1 to IE1-5. The second signal lines SL2-1 to SL2-4 may be respectively electrically connected to ends of the second sensing electrodes IE2-1 to IE2-4. In an embodiment, the first signal lines SL1-1 to SL1-5 may also be electrically connected to the ends of the first sensing electrodes IE2-1 to IE2-4, respectively. In an embodiment, each of the second signal lines SL2-1 to SL2-4 may be electrically connected to an end of each of the second sensing electrodes IE2-1 to IE2-4.

As a comparative example, the sensing sensitivity may be improved compared to the input sensing section 40 including the second signal lines SL2-1 to SL2-4, each of which may be electrically connected to an end of each of the second sensing electrodes IE2-1 to IE2-4. Since the second sensing electrodes IE2-1 to IE2-4 may have greater lengths than the first sensing electrodes IE1-1 to IE1-5, voltages of detection signals (or transmission signals) may drop, and the sensing sensitivity may decrease accordingly. According to an embodiment, since the detection signals (or the transmission signals) may be provided through the second signal lines SL2-1 to SL2-4 respectively electrically connected to both ends of the second sensing electrodes IE2-1 to IE2-4, the decrease in the sensing sensitivity may be prevented by preventing the voltage drop of the detection signals (or the transmission signals).

The first signal lines SL1-1 to SL1-5 and the second signal lines SL2-1 to SL2-4 may include line portions SL-L and pad portions SL-P.

Referring to FIGS. 22 and 23, in an embodiment, the first sensing electrodes IE1-1 to IE1-5 and the second sensing electrodes IE2-1 to IE2-4 may have substantially mesh shapes. As the first sensing electrodes IE1-1 to IE1-5 and the second sensing electrodes IE2-1 to IE2-4 have substantially mesh shapes, a parasitic capacitance with the opposite electrode may decrease. As described below, since the first sensing electrodes IE1-1 to IE1-5 and the second sensing electrodes IE2-1 to IE2-4 may not overlap emission areas EA-R, EA-G and EA-B, the display apparatus may not be viewed by the user.

The first sensing electrodes IE1-1 to IE1-5 and the second sensing electrodes IE2-1 to IE2-4 having the substantially mesh shapes may include Ag, Al, Cu, Cr, Ni, Ti, or the like to which a low-temperature process may be applied. However, one or more embodiments are not limited thereto. Although the input sensing section 40 may be formed by using consecutive processes, damage to the organic light-emitting diode OLED may be prevented.

FIG. 23 shows the first sensing portions SP1, but the second sensing portions SP2 may have substantially the same structures as the first sensing portions SP1. The first sensing portions SP1 may not overlap the emission areas EA-R, EA-G and EA-B and may overlap non-emission areas NEA.

Mesh lines of the first sensing portions SP1 may define mesh holes OPR, OPG and OPB (hereinafter, referred to as mesh holes). The mesh lines may each have a tri-layer structure of Ti/Al/Ti. The mesh holes OPR, OPG and OPB may correspond to the emission areas EA-R, EA-G and EA-B in a one-to-one correspondence.

It is shown that the mesh holes OPR, OPG and OPB may correspond to the emission areas EA-R, EA-G and EA-B in a one-to-one correspondence. However, one or more embodiments are not limited thereto. Each of the mesh holes OPR, OPG and OPB may correspond to two or more emission areas. As shown in FIG. 23, planar shapes of the mesh holes OPR, OPG and OPB may be rhombuses, corresponding to the shapes of the emission areas EA-R, EA-G and EA-B. However, one or more embodiments are not limited thereto. The planar shapes of the mesh holes OPR, OPG and OPB may be polygons, for example, polygons having rounded corners, which may be different from the rhombuses.

Figure 24:
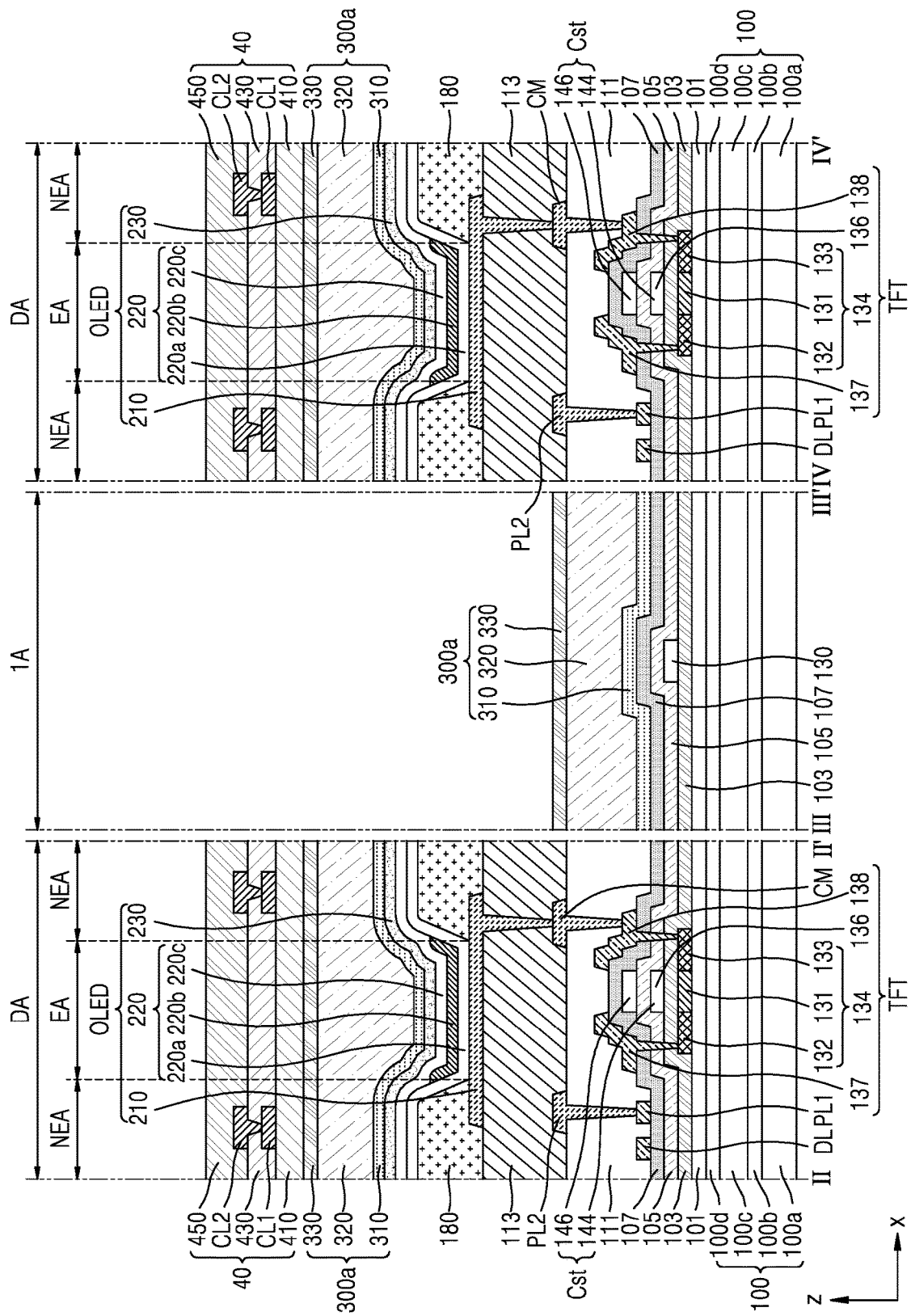
FIG. 24 is a schematic cross-sectional view of a portion of a display apparatus according to an embodiment.

FIG. 24 is a schematic cross-sectional view of a portion or region of the display apparatus according to an embodiment.

The embodiment of FIG. 24 may differ from that of FIG. 9 in that the input sensing section 40 may be disposed on the thin film encapsulation layer 300a of the display area DA. Structures of FIG. 24, which may be identical to those of FIG. 9, will not be described again, and a difference therebetween will be mainly described hereinafter.

Referring to FIG. 24, the input sensing section 40 may be disposed on the thin film encapsulation layer 300a in the display area DA. For example, the first touch insulating layer 410 may be disposed on the thin film encapsulation layer 300a, the first conductive layer CL1 may be disposed on the first touch insulating layer 410, the second touch insulating layer 430 may be disposed on the first conductive layer CL1, the second conductive layer CL2 may be disposed on the second touch insulating layer 430, and the third touch insulating layer 450 may be disposed on the second conductive layer CL2.

On the thin film encapsulation layer 300a of the first area 1A, the input sensing section 40, which may be disposed in the display area DA, may not be disposed. As the input sensing section 40 is not disposed in the first area 1A, the transmittance of the first area 1A may be improved.

Figure 25:
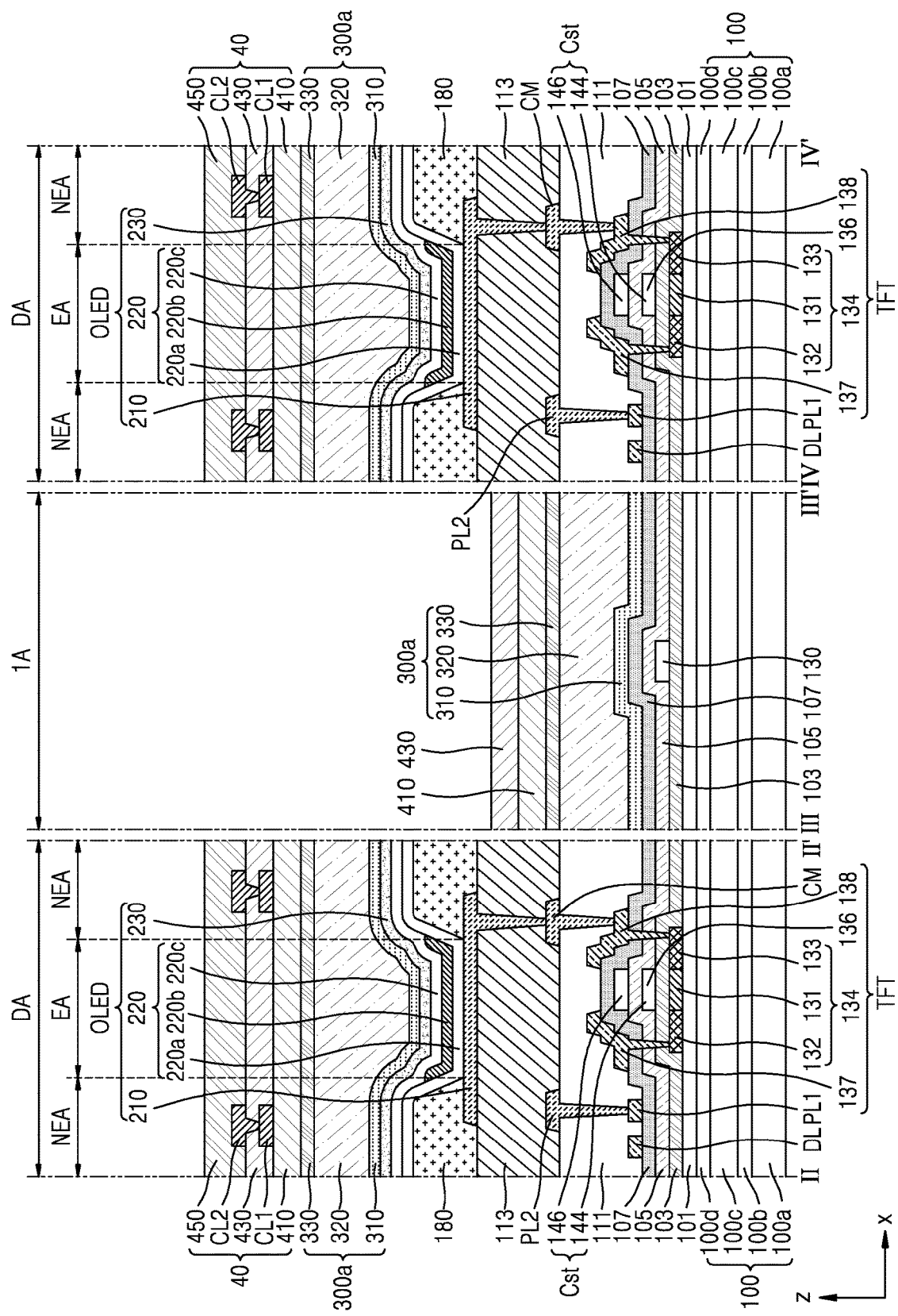
FIG. 25 is a schematic cross-sectional view of a portion of a display apparatus according to an embodiment.

FIG. 25 is a schematic cross-sectional view of a portion or region of the display apparatus according to an embodiment.

The embodiment of FIG. 25 may differ from that of FIG. 24 in that the first touch insulating layer 410 and the second touch insulating layer 430 of the input sensing section 40 may be disposed in the first area 1A. Structures of FIG. 25, which may be identical to those of FIG. 24, will not be described again, and a difference therebetween will be mainly described hereinafter.

Referring to FIG. 25, the first touch insulating layer 410 and the second touch insulating layer 430 of the input sensing section 40 may be disposed on the thin film encapsulation layer 300a of the first area 1A. For example, the first touch insulating layer 410 and the second touch insulating layer 430 of the input sensing section 40 may be disposed on an upper surface of the second inorganic encapsulation layer 330 of the thin film encapsulation layer 300a.

Figure 26:
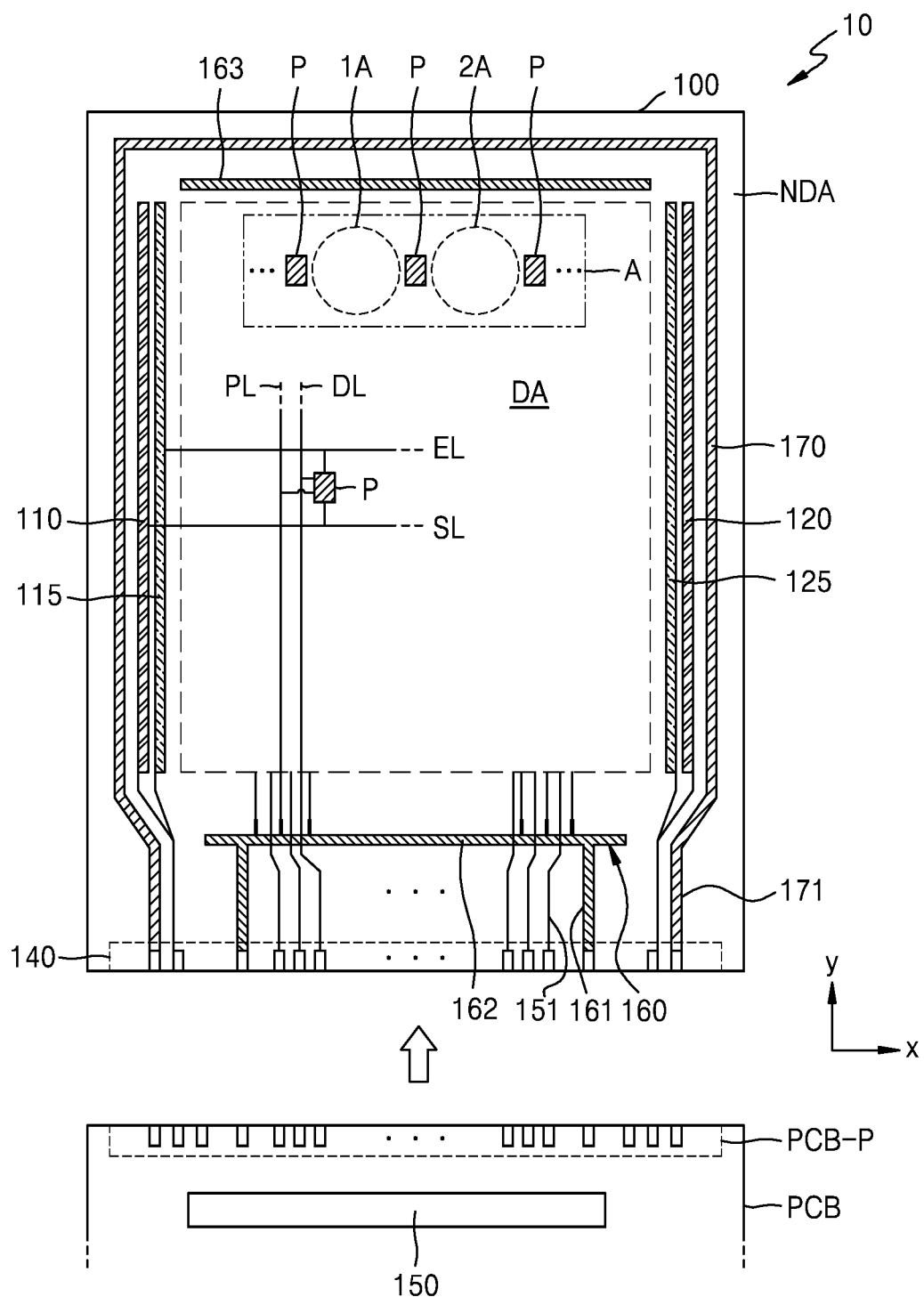
FIG. 26 is a plan view of a display panel according to an embodiment.

FIG. 26 is a schematic plan view of a display panel according to an embodiment.

The embodiment of FIG. 26 may differ from that of FIG. 4 in that the substrate 100 may include the second area 2A separate from the first area 1A. Structures of FIG. 26, which may be identical to those of FIG. 4, will not be described again, and a difference therebetween will be mainly described hereinafter.

Referring to FIG. 26, the substrate 100 may include the first area 1A, the second area 2A, and the display area DA surrounding the first area 1A and the second area 2A. The first area 1A and the second area 2A may be separate from each other. The first area 1A and the second area 2A may be surrounded by the display area DA. Corresponding to bottom portions of the first area 1A and the second area 2A of the display panel 10, at least one component 20 (FIG. 2) may be disposed. In the first area 1A and the second area 2A, the pixels P may not be disposed. As shown in FIG. 25, there may be one first area 1A and one second area 2A, and the shapes of the first area 1A and the second area 2A may be circles. However, one or more embodiments are not limited thereto.

FIG. 27 is a plan view of a portion or region of the display apparatus according to an embodiment.

The embodiment of FIG. 27 may differ from that of FIG. 7 in that the second area 2A that may be separate from the first area 1A may be included. Structures of FIG. 27, which may be identical to those of FIG. 7, will not be described again, and a difference therebetween will be mainly described hereinafter.

Referring to FIG. 27, the display apparatus 1 according to an embodiment may include the first area 1A, the second area 2A, and the display area DA surrounding the first area 1A and the second area 2A. In the display area DA, the pixels P may be arranged or disposed.

In the display area DA, the scan lines SL, the emission control lines EL, and the data lines DL may be arranged or disposed. The scan lines SL may respectively provide the scan signals to the pixels P, may extend in the first direction (the x direction), and may be disconnected in the first area 1A therebetween. The scan lines SL, which may be disconnected in the first area 1A therebetween, may be arranged or disposed in the first area 1A and may be electrically connected by first scan connection lines 122 extending in the first direction (the x direction). In an embodiment, the scan lines SL and the first scan connection lines 122 may be electrically connected through the contact holes CNT, and the contact holes CNT electrically connecting the scan lines SL and the first scan connection lines 122 may be arranged or disposed in the display area DA. Although not shown, the scan lines SL and the first scan connection lines 122 may be at the same layer and may include the same or similar material. For example, the scan lines SL and the first scan connection lines 122 may be integrally formed.

The scan lines SL may respectively provide the scan signals to the pixels P, may extend in the first direction (the x direction), and may be disconnected in the second area 2A therebetween. The scan lines SL, which may be disconnected in the second area 2A therebetween, may be arranged or disposed in the second area 2A and may be electrically connected by second scan connection lines 126 extending in the first direction (the x direction). In an embodiment, the scan lines SL and the second scan connection lines 126 may be electrically connected through the contact holes CNT, and the contact holes CNT electrically connecting the scan lines SL and the second scan connection lines 126 may be located or disposed in the display area DA. Although not shown, the scan lines SL and the second scan connection lines 126 may be at the same layer and may include the same or similar material. For example, the scan lines SL and the second scan connection lines 126 may be integrally formed.

In an embodiment, the scan lines SL may be at the same layer as the upper electrode 146 (see FIG. 9), and the first scan connection lines 122 and the second scan connection lines 126 may be at the same layer as the gate electrode 136 (see FIG. 9). In an embodiment, the scan lines SL may be at the same layer as the gate electrode 136 (see FIG. 9), and the first scan connection lines 122 and the second scan connection lines 126 may be at the same layer as the gate electrode 136 (see FIG. 9).

The emission control lines EL may respectively provide the emission control signals to the pixels P, may extend in the first direction (the x direction), and may be disconnected in the first area 1A therebetween. The emission control lines EL, which may be disconnected in the first area 1A therebetween, may be arranged or disposed in the first area 1A and may be electrically connected by first emission control connection lines 124 extending in the first direction (the x direction). In an embodiment, the emission control lines EL and the first emission control connection lines 124 may be at the same layer and may include the same or similar material. For example, the emission control lines EL and the first emission control connection lines 124 may be integrally formed. Although not shown, the emission control lines EL and the first emission control connection lines 124 may be electrically connected through the contact holes CNT, and the contact holes CNT electrically connecting the emission control lines EL and the first emission control connection lines 124 may be located or disposed in the display area DA.

The emission control lines EL may respectively provide the emission control signals to the pixels P, may extend in the first direction (the x direction), and may be disconnected in the second area 2A therebetween. The emission control lines EL, which may be disconnected in the second area 2A therebetween, may be arranged or disposed in the second area 2A and may be electrically connected by second emission control connection lines 128 extending in the first direction (the x direction). In an embodiment, the emission control lines EL and the second emission control connection lines 128 may be at the same layer and include the same or similar material. For example, the emission control lines EL and the second emission control connection lines 128 may be integrally formed. Although not shown, the emission control lines EL and the second emission control connection lines 128 may be electrically connected through the contact holes CNT, and the contact holes CNT electrically connecting the emission control lines EL and the second emission control connection lines 128 may be located or disposed in the display area DA.

In an embodiment, the emission control lines EL may be at the same layer as the gate electrode 136 (see FIG. 9), and the first emission control connection lines 124 and the second emission control connection lines 128 may be at the same layer as the gate electrode 136 (see FIG. 9). In an embodiment, the emission control lines EL may be at the same layer as the upper electrode 146 (see FIG. 9), and the first emission control connection lines 124 and the second emission control connection lines 128 may be at the same layer as the gate electrode 136 (see FIG. 9).

The data lines DL may respectively provide the data signals to the pixels P, may extend in the second direction (the y direction) crossing or intersecting the first direction (the x direction), and may be disconnected in the first and second areas 1A and 2A therebetween. The data lines DL, which may be disconnected in the first area 1A therebetween, may be arranged or disposed in the first area 1A and electrically connected by the data connection lines 130 extending in the second direction (the y direction). The data lines DL, which may be disconnected in the second area 2A therebetween, may be arranged or disposed in the second area 2A and electrically connected by the data connection lines 130 extending in the second direction (the y direction).

The data lines DL and the data connection lines 130 may be electrically connected through the contact holes CNT, and the contact holes CNT electrically connecting the data lines DL and the data connection lines 130 may be located or disposed in the display area DA.

In an embodiment, the data lines DL may be at the same layer as the source electrode 137 (see FIG. 9) and the drain electrode 138 (see FIG. 9), and the data connection lines 130 may be at the same layer as the upper electrode 146 (see FIG. 9).

According to an embodiment of the disclosure, in an existing display apparatus, in a case that grooves may be formed or disposed in a substrate including polymer materials and some or a predetermined number of portions of the substrate may be removed by laser, display devices may be damaged due to external impurities such as moisture, and thus problems such as the reliability degradation of the display apparatus have occurred.

The disclosure is to solve the above problems, and according to one or more embodiments of the disclosure, instead of employing the structure in which the grooves may be formed or disposed in the substrate including the polymer materials and portions of the substrate may be removed by laser, lines and insulating layers, which may be arranged or disposed in a first area where an image device may be located or disposed, may be reduced to improve the reliability of a display apparatus and at the same time prevent damage to display devices due to external impurities.

As described above, according to the one or more embodiments of the disclosure, a display apparatus may be realized that prevents damage to display devices due to external impurities such as moisture with respect to the first area and has improved reliability. However, the scope of the disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate comprising a first area, a display area surrounding the first area, and a non- display area surrounding the display area;
a plurality of pixels disposed in the display area;
scan lines extending in a first direction and disconnected in the first area;
data lines extending in a second direction intersecting the first direction and disconnected in the first area; and
data connection lines electrically connecting the data lines disconnected in the first area,
wherein the data connection lines are disposed in the first area.

2. The display apparatus of claim 1, wherein data connection lines are extend in the second direction.

3. The display apparatus of claim 2, wherein
each of the plurality of pixels comprises a thin film transistor and a storage capacitor,
the thin film transistor comprises a semiconductor layer, a gate electrode overlapping the semiconductor layer, and a connection electrode electrically connected to the semiconductor layer, and
the storage capacitor comprises a lower electrode and an upper electrode overlapping the lower electrode.

4. The display apparatus of claim 3, wherein
the data lines and the connection electrode are disposed at a same layer, and
the data connection lines and the gate electrode are disposed at a same layer.

5. The display apparatus of claim 2, wherein
the data lines and the data connection lines are electrically connected through contact holes, and
the contact holes are disposed in the display area.

6. The display apparatus of claim 1, further comprising emission control lines extending in the first direction and disconnected in the first area.

7. The display apparatus of claim 1, further comprising a plurality of insulating layers disposed in the display area,
wherein at least one of the plurality of insulating layers is disposed in the first area.

8. The display apparatus of claim 3, further comprising a display device electrically connected to the thin film transistor and comprising:
a pixel electrode;
an opposite electrode including a first hole corresponding to the first area; and
an intermediate layer disposed between the pixel electrode and the opposite electrode.

9. The display apparatus of claim 8, further comprising a thin film encapsulation layer disposed on the display device and comprising:
at least one inorganic encapsulation layer; and
at least one organic encapsulation layer.

10. The display apparatus of claim 9, further comprising an input sensing section disposed on the thin film encapsulation layer and comprising:
sensing electrodes;
trace lines electrically connected to the sensing electrodes; and
a second hole corresponding to the first area.

11. The display apparatus of claim 10, further comprising an optical functional section disposed on the input sensing section and comprising a third hole corresponding to the first area.

12. The display apparatus of claim 3, wherein
the data lines and the connection electrode are disposed at a same layer, and
the data connection lines and the upper electrode are disposed at a same layer.

13. The display apparatus of claim 1, further comprising a protection layer disposed on the data lines and the data connection lines,
wherein the data lines and the data connection lines are disposed at a same layer.

14. The display apparatus of claim 1, wherein the data connection lines bypass edges of the first area and extend in the second direction.

15. The display apparatus of claim 1, wherein the substrate comprises polymer resin or glass.

16. The display apparatus of claim 3, wherein
the substrate further comprises a second area separate from the first area,
the data lines are disconnected in the second area, and
the data connection lines electrically connect the data lines disconnected in the second area.

17. The display apparatus of claim 16, further comprising a first scan connection line disposed in the first area and extending in the first direction,
wherein the first scan connection line electrically connects the scan lines disconnected in the first area.

18. The display apparatus of claim 17, wherein
the scan lines and the first scan connection line are electrically connected through contact holes, and
the contact holes are disposed in the display area.

19. The display apparatus of claim 17, wherein the scan lines are disconnected in the second area.

20. The display apparatus of claim 19, further comprising a second scan connection line disposed in the second area and extending in the first direction,
wherein the second scan connection line electrically connects the scan lines disconnect in the second area.

21. The display apparatus of claim 20, wherein
the scan lines and the second scan connection line are electrically connected through contact holes, and
the contact holes are disposed in the display area.

22. The display apparatus of claim 20, wherein the first scan connection line, the second scan connection line, and the gate electrode are disposed at a same layer.

23. The display apparatus of claim 16, wherein the data connection lines and the upper electrode are disposed at a same layer.

24. A display apparatus comprising:
a substrate comprising a first area, a display area surrounding the first area, and a non- display area surrounding the display area;
a component comprising an electronic element disposed in an area corresponding to the first area;
scan lines extending in a first direction and disconnected in the first area;
data lines extending in a second direction intersecting the first direction and disconnected in the first area;
data connection lines electrically connecting the data lines disconnected in the first area;
an opposite electrode disposed on the data lines and comprising a first hole corresponding to the first area;
a thin film encapsulation layer disposed on the opposite electrode and comprising at least one inorganic encapsulation layer and at least one organic encapsulation layer;
an input sensing section disposed on the thin film encapsulation layer and comprising a second hole corresponding to the first area; and
an optical functional section disposed on the input sensing section and comprising a third hole corresponding to the first area,
wherein the data connectionBines are disposed in the first area.

25. The display apparatus of claim 24, wherein the component comprises a sensor or an imaging device.

* * * * *